United States Patent
Nakamura et al.

(10) Patent No.: US 8,525,356 B2
(45) Date of Patent: Sep. 3, 2013

(54) WIRING SUBSTRATE, MANUFACTURING METHOD THEREOF, AND SEMICONDUCTOR PACKAGE

(75) Inventors: Junichi Nakamura, Nagano (JP); Kazuhiro Kobayashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 334 days.

(21) Appl. No.: 12/968,405

(22) Filed: Dec. 15, 2010

(65) Prior Publication Data
US 2011/0169164 A1 Jul. 14, 2011

(30) Foreign Application Priority Data
Jan. 13, 2010 (JP) .................................. 2010-005017

(51) Int. Cl.
*H01L 23/544* (2006.01)
(52) U.S. Cl.
USPC .................................. 257/797; 257/E23.179
(58) Field of Classification Search
USPC .................................. 257/739, 797, E23.179
See application file for complete search history.

(56) References Cited

U.S. PATENT DOCUMENTS

| | | | |
|---|---|---|---|
| 6,180,498 B1* | 1/2001 | Geffken et al. | 438/462 |
| 7,954,234 B2* | 6/2011 | Kodani et al. | 29/852 |
| 2004/0047938 A1* | 3/2004 | Kosuga et al. | 425/406 |
| 2007/0062729 A1* | 3/2007 | Asai et al. | 174/262 |
| 2008/0245549 A1* | 10/2008 | Kodani et al. | 174/126.1 |
| 2012/0199389 A1* | 8/2012 | Furutani et al. | 174/264 |

FOREIGN PATENT DOCUMENTS

| | | | |
|---|---|---|---|
| JP | 03268316 A | * | 11/1991 |
| JP | 10-125819 | | 5/1998 |
| JP | 1140908 A | * | 2/1999 |
| JP | 2002-198462 | | 7/2002 |
| JP | 2009-033183 | | 2/2009 |

* cited by examiner

*Primary Examiner* — Matthew Landau
*Assistant Examiner* — Joseph C Nicely
(74) *Attorney, Agent, or Firm* — IPUSA,PLLC

(57) ABSTRACT

A disclosed wiring substrate includes an insulating layer, a recess formed on a surface of the insulating layer, and an alignment mark formed inside of the recess, wherein a face of the alignment mark is roughened, recessed from the surface of the insulating layer, and exposed from the recess.

11 Claims, 35 Drawing Sheets

10

WIRING SUBSTRATE, MANUFACTURING METHOD THEREOF, AND SEMICONDUCTOR PACKAGE

CROSS-REFERENCE TO RELATED APPLICATIONS

This patent application is based upon and claims the benefit of priority of Japanese Patent Application No. 2010-005017 filed on Jan. 13, 2010, the entire contents of which are incorporated herein by reference.

BACKGROUND OF THE INVENTION

1. Field of the Invention

The present invention generally relates to a wiring substrate having one of faces being roughened and an alignment mark, a manufacturing method of the wiring substrate, and a semiconductor package having the wiring substrate on which the semiconductor chip is mounted.

2. Description of the Related Art

An example of a build-up substrate is described. There is an example of a wiring substrate made by a build-up manufacturing method. FIG. 1 is a cross-sectional view of a part of the example wiring substrate manufactured by the build-up manufacturing method without having a core (coreless wiring substrate). The coreless wiring substrate 100 has a structure in which first wiring layers 110, a first insulating layer 120, second wiring layers 130, and a second insulating layer 140 are sequentially laminated.

In the wiring substrate 100, the first wiring layers 110 are provided inside recesses 120y formed on one side of the first insulating layer 120. Faces 110s of the first wiring layers 110 are exposed from the recesses 120y. The first wiring layer 110 includes the electrode pad 110a and an alignment mark 110b. The electrode pads 110a are used as connection terminals connected to a semiconductor chip. The alignment mark 110b is used as a standard for aligning electronic components such as the semiconductor chip with the wiring substrate 100, a standard for aligning the wiring substrate 100 with another wiring substrate, or the like.

Second wiring layers 130 are formed on the opposite side of the first insulating layer 120. The second wiring layers 130 are made of vias which penetrate through the first insulating layer 120, fill inside first via holes 120x, and expose upper surfaces of the vias; and an interconnection pattern formed on the face of the first insulating layer 120. The second wiring layers 130 are electrically connected to the electrode pads 110a exposed toward the first via holes 120x.

The second insulating layer 140 is formed to cover the second wiring layers 130 on the first insulating layer 120. It is possible to further laminate other wiring and insulating layers when necessary.

Next, a manufacturing method of the wiring substrate 100 is described. FIG. 2 thru FIG. 5 illustrate manufacturing processes of the example semiconductor device illustrated in FIG. 1. In FIG. 2 to FIG. 5, the same reference symbols are attached to the same parts and descriptions of these parts are omitted. Referring to FIG. 2, a supporting body 210 made of a copper foil is prepared. On one surface of the supporting body 210, a resist layer 220 is formed having opening portions 220x corresponding to positions in which the first wiring layers 110 are formed.

Referring to FIG. 3, metallic layers 230 and the first wiring layers 110 are laminated on one of the surfaces of the supporting body 210 by an electrolytic plating method using the supporting body 210 as a power supplying layer. The material of the metallic layers 230 may be nickel (Ni). The material of the first wiring layers 110 may be copper (Cu) or the like. The faces 110s of the first wiring layers 110 are in contact with the faces 230s of the metallic layers 230.

Referring to FIG. 4, after removing the resist layer 220 illustrated in FIG. 3, the first insulating layer 120 is formed so as to cover the metallic layers 230, the first wiring layers 110, and the surface of the supporting body 210. After forming the first via holes 120x on the first insulating layer 120, the second wiring layers 130 electrically connected to the first wiring layers 110 are formed on the first insulating layer 120 through the first via holes 120x. The second insulating layer 140 is formed to cover the second wiring layers 130 on the first insulating layer 120, and other wiring and insulating layers when necessary.

The supporting body 210 illustrated in FIG. 4 is removed in the process illustrated in FIG. 5. An etching liquid capable of removing the supporting body 210 made of the copper foil and not capable of removing the metallic layers 230 is used. With this, the metallic layers 230 function as etching stopper layers to enable removing only the supporting body 210.

Next, the metallic layers 230 are removed by etching using an etching liquid which can remove only the metallic layers 230 made of nickel (Ni). With this the faces 110s of the first wiring layers 110 are exposed to the outside and the wiring substrate 100 illustrated in FIG. 1 is completed.

The faces 230s of the metallic layers 230 made of nickel (Ni) and formed by an electrolytic plating method are ordinarily flat. Therefore, the faces 110s of the first wiring layers 110 including the electrode pads 110a and the alignment mark 110b in contact with the faces 230s of the metallic layers 230 which are exposed after the process illustrated in FIG. 5 are also flat. The surface roughness Ra of the flat faces is 50 nm or less (Ra≦50).

As described above, the alignment mark 110b is used as a standard for aligning electronic components such as the semiconductor chip with the wiring substrate 100, a standard for aligning the wiring substrate 100 with another wiring substrate, or the like. If the face 110s of the alignment mark 110b is not flat, there occurs a problem that the semiconductor chip and the wiring substrate 100 are not properly aligned. Referring to FIG. 6, the problem is described.

FIG. 6 illustrates reflection of light by the example alignment mark 110b. Referring to FIG. 6, the same reference symbols are attached to the same parts and descriptions of these parts are omitted. FIG. 6 illustrates the opposite cross-sectional view of the wiring substrate 100. The electrode pads 110a are used as connection terminals connected to a semiconductor chip. The semiconductor chip is installed on the side of the electrode pads 110a of the wiring substrate 100 while aligning the semiconductor chip with the wiring substrate 100.

Referring to FIG. 6, when the semiconductor chip (not illustrated) is aligned with the wiring substrate 100, a light source 910 irradiates a visible light or the like on faces 110s of the alignment mark 110b. The light reflected on the faces 110s is received by a light receiving unit 920 of a CCD camera or the like to thereby recognize the alignment mark 110b. Based on the recognized alignment mark 110b, the semiconductor chip (not illustrated) is aligned with the wiring substrate 100. Since it is necessary to arrange the light source 910 at a position in which the light source 910 does not obstruct the light receiving unit 920, the irradiating light may obliquely impinge on the face 110s of the alignment mark 110b.

When the face 110s of the alignment mark 110b is flat, the irradiating light from the light source 910 scarcely causes diffused reflection on the face 110s. Therefore, most of the irradiating light from the light source 910 becomes reflection light having a reflection angle (angle between the reflection light and the Z axis) substantially the same as an incident angle (angle between the irradiating light and the Z axis). Thus, the reflection light is not directed toward the light receiving unit 920 and is directed in the arrow direction in FIG. 6. As a result, most of the irradiating light from the light source 910 does not impinge on the light receiving unit 920. Therefore, it is difficult to recognize the alignment mark 110*b*. When the alignment mark 110*b* is not recognized, there occurs a problem that the semiconductor chip cannot be installed on the wiring substrate 100.

[Patent Document 1] Japanese Laid-open Patent Publication No. H10-125819
[Patent Document 2] Japanese Laid-open Patent Publication No. 2002-198462
[Patent Document 3] Japanese Laid-open Patent Publication No. 2009-033183

SUMMARY OF THE INVENTION

Accordingly, embodiments of the present invention may provide a novel and useful wiring substrate having an easily recognizable alignment mark, a manufacturing method of the wiring substrate, and a semiconductor package having the wiring substrate on which various electronic components such as a semiconductor chip and a chip capacitor are installed solving one or more of the problems discussed above.

Means for Solving the Problem

More specifically, the embodiments of the present invention may provide a wiring substrate including an insulating layer, a recess formed on a surface of the insulating layer, and an alignment mark formed inside of the recess, wherein a face of the alignment mark is roughened, recessed from the surface of the insulating layer, and exposed from the recess.

Another aspect of the present invention may be to provide a manufacturing method of a wiring substrate including forming a metallic layer on a surface of a supporting body, laminating a wiring layer to be an alignment mark on the metallic layer, forming an insulating layer on the surface of the supporting body to cover the metallic layer and the wiring layer, roughening a face of the wiring layer, and exposing the face of the wiring layer from the insulating layer by removing the supporting body and the metallic layer.

Another aspect of the present invention may be to provide semiconductor package including a semiconductor chip, and a wiring substrate in which the semiconductor chip is mounted, the wiring substrate including an insulating layer, a recess formed on a surface of the insulating layer, and an alignment mark formed inside of the recess, wherein a face of the alignment mark is roughened, recessed from the surface of the insulating layer, and exposed from the recess.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 7 through FIG. 35 of embodiments of the present invention. Hereinafter, reference symbols typically designate as follows:
10, 10A, 30: Wiring substrate;
11: First wiring layers;
11a: Electrode pad;
11b: Alignment mark;
11s, 23s: Face;
12a, 12b: Surface;
12: First insulating layer;
12x: First via hole;
12y: Recess;
13: Second wiring layer;
14: Second insulating layer;
14x: Second via hole;
15: Third wiring layer;
16: Third insulating layer;
16x: Third via hole;
17: Fourth wiring layer;
18: Solder resist layer;
18x, 22x, 22y: Opening portion;
21: Supporting body;
22: Resist layer;
23: Metallic layer;
24: Depth adjusting layer;
40, 40A: Semiconductor package;
50: Semiconductor chip;
51: Semiconductor substrate;
52: Electrode pad;
55: Chip capacitor;
56: Solder;
57: External connection terminal;
60: Solder bump;
61, 62: Presolder;
70: Underfill resin;
91: Light source; and
92: Light receiving unit.

Embodiment 1

The Structure of a Wiring Substrate of Embodiment 1

Figure 1:
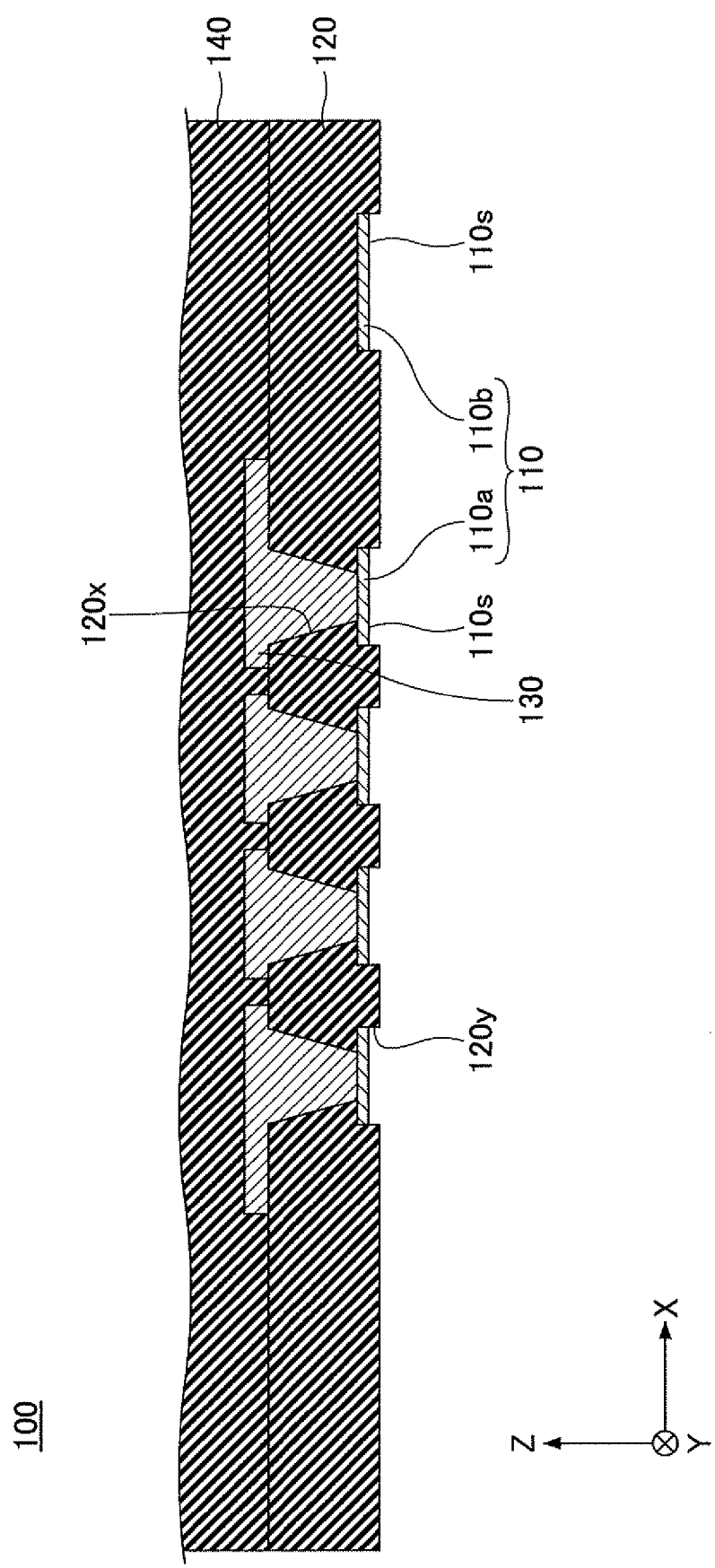
FIG. 1 is a cross-sectional view illustrating an example wiring substrate.
Figure 2:
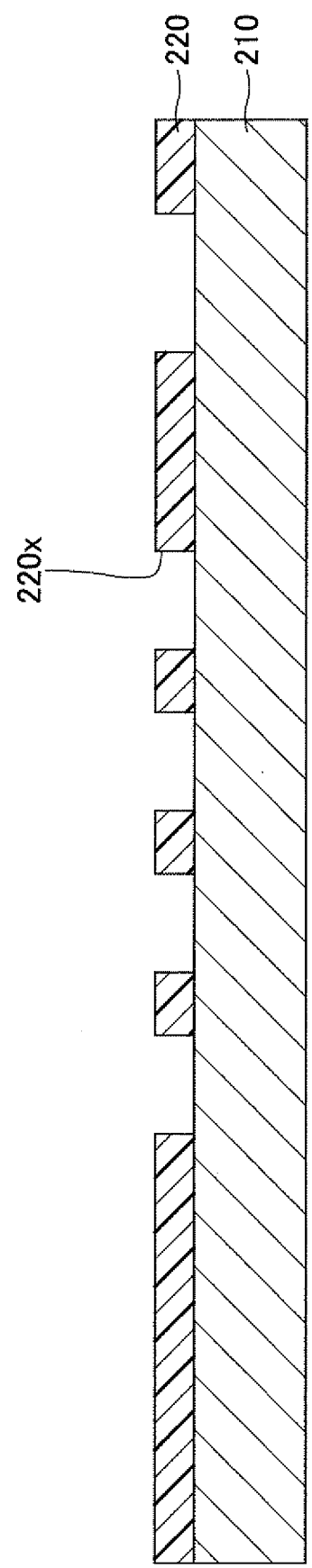
FIG. 2 illustrates a first manufacturing step using a cross-sectional view of the example wiring substrate.
Figure 3:
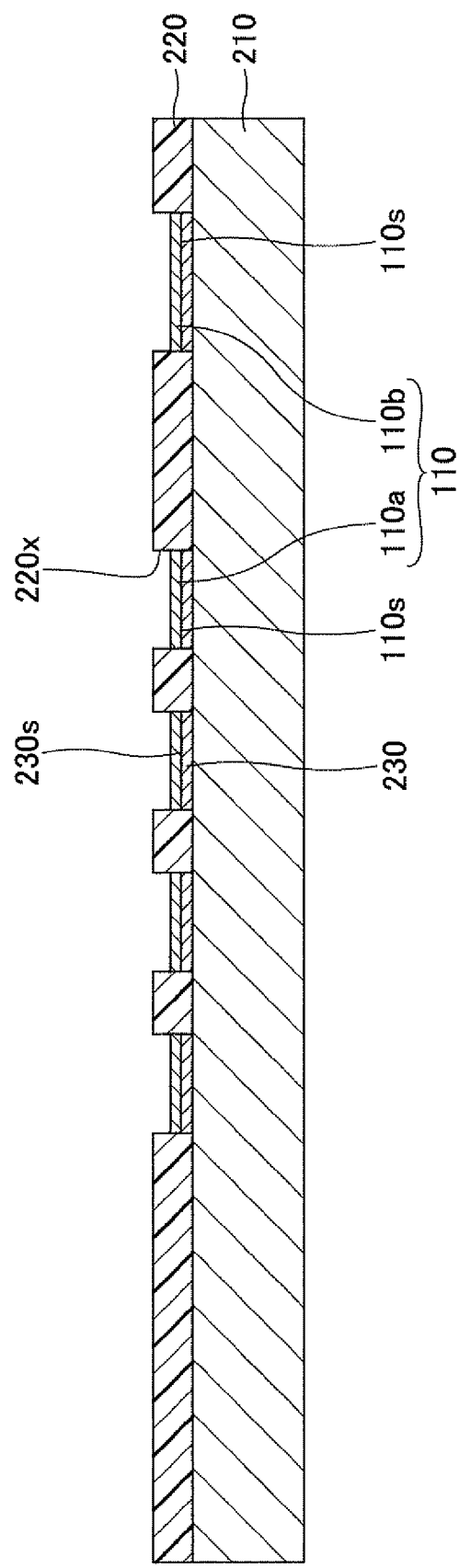
FIG. 3 illustrates a second manufacturing step using a cross-sectional view of the example wiring substrate.
Figure 4:
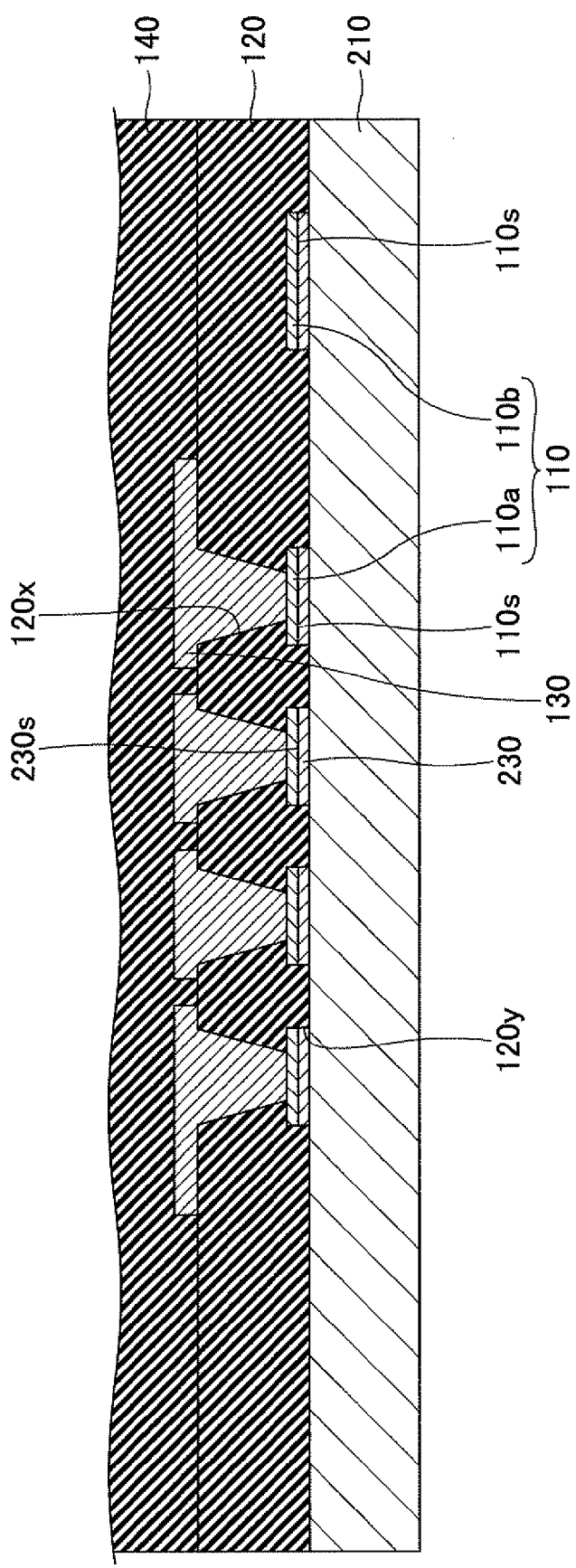
FIG. 4 illustrates a third manufacturing step using a cross-sectional view of the example wiring substrate.
Figure 5:
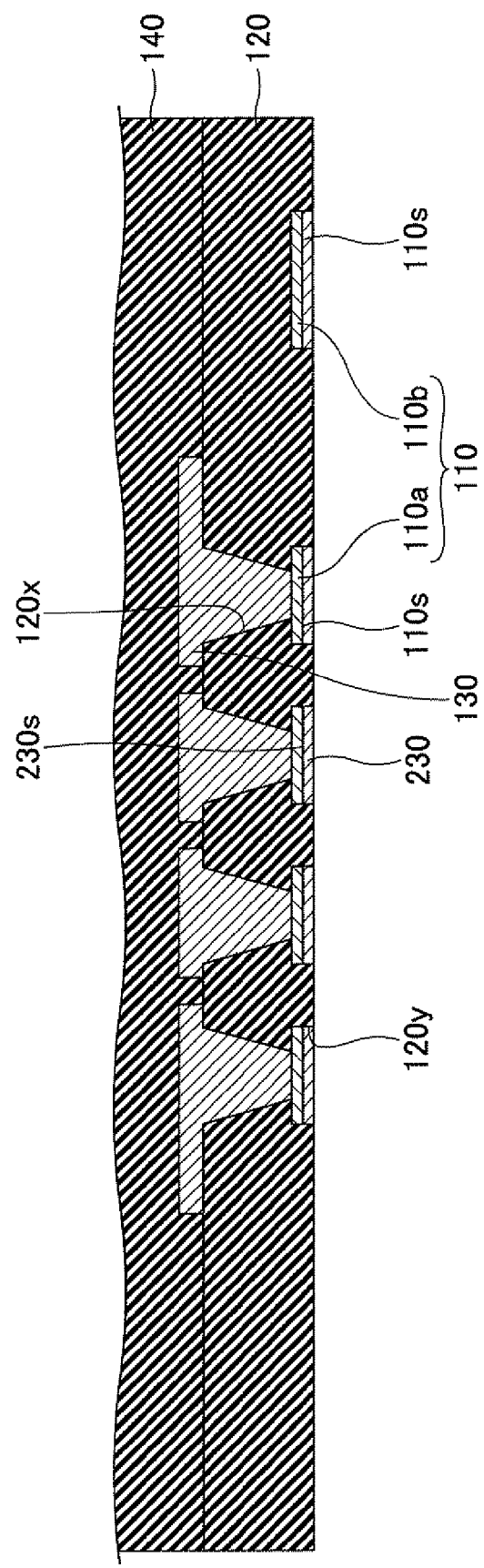
FIG. 5 illustrates a fourth manufacturing step using a cross-sectional view of the example wiring substrate.
Figure 6:
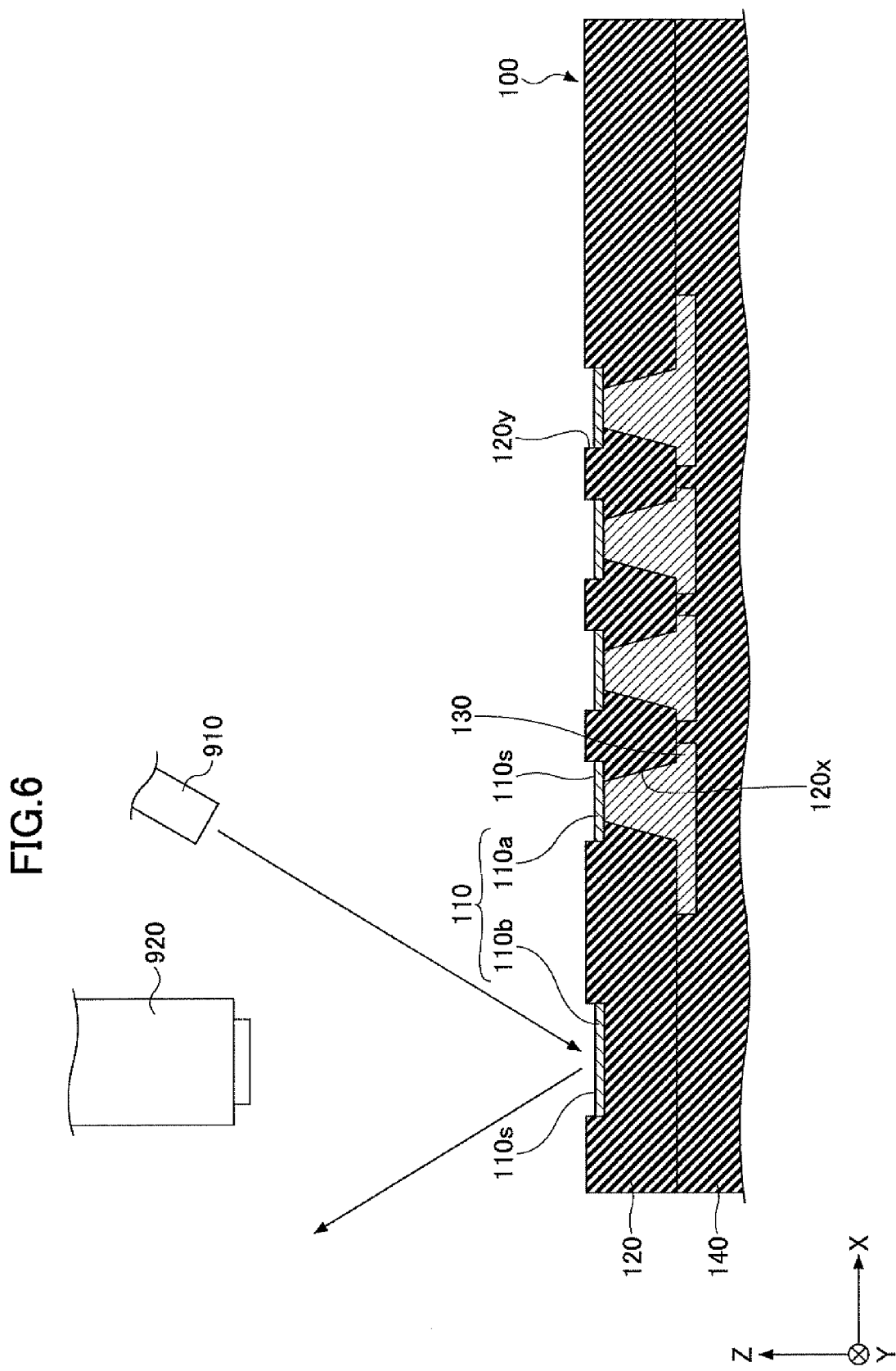
FIG. 6 illustrates reflection of light by an example alignment mark.
Figure 7:
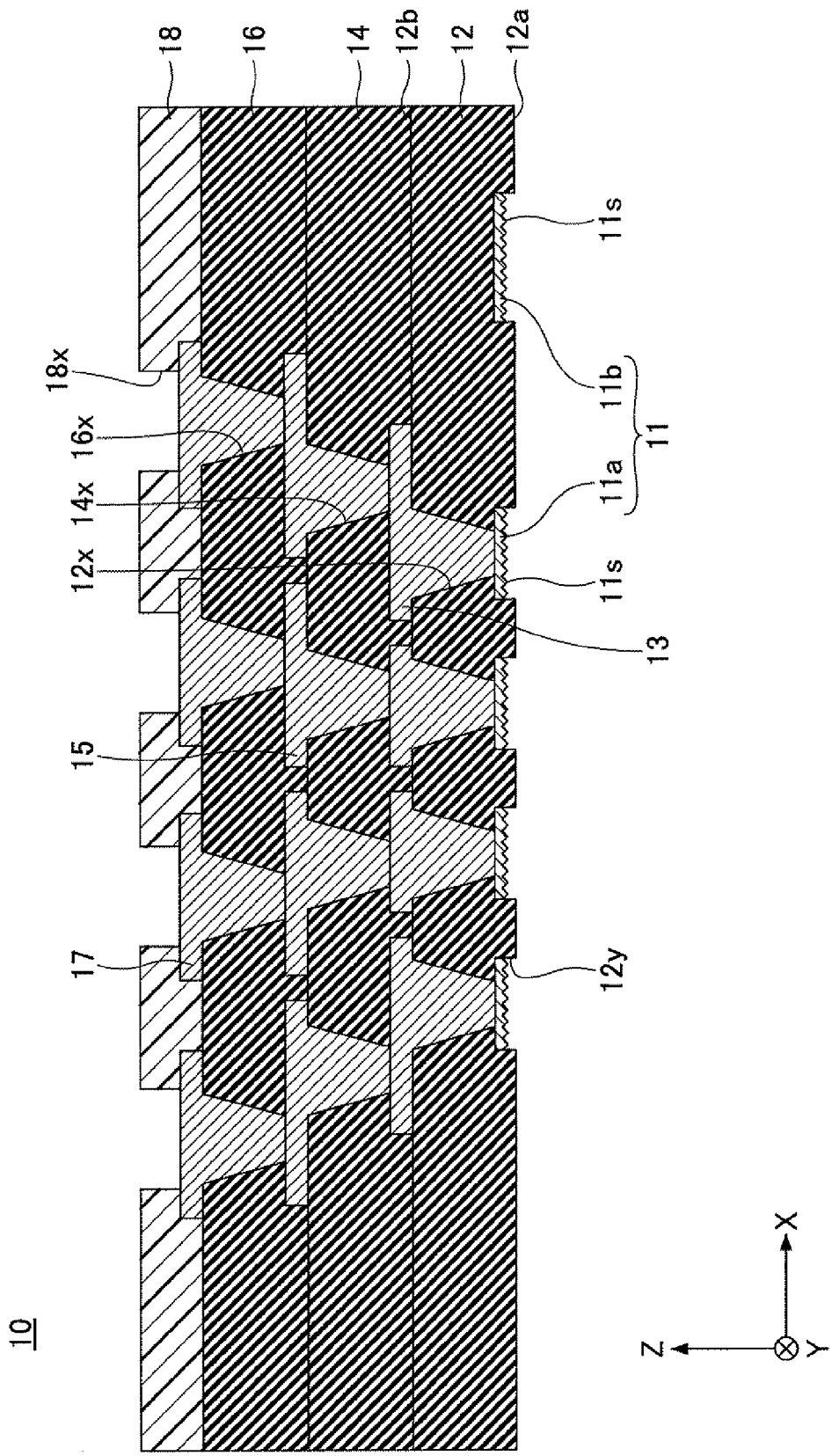
FIG. 7 is an example cross-sectional view of a wiring substrate of Embodiment 1.

First, the structure of a wiring substrate of Embodiment 1 is described. FIG. 7 is an example cross-sectional view of a wiring substrate of Embodiment 1. Referring to FIG. 7, the wiring substrate 10 has a structure in which first wiring layers 11, a first insulating layer 12, second wiring layers 13, a second insulating layer 14, third wiring layers 15, a third insulating layer 16, fourth wiring layers 17, and a solder resist layer 18 are laminated.

In the wiring substrate 10, the first wiring layers 11 are provided inside recesses 12y formed on a surface 12a of the first insulating layer 12. The faces 11s of the first wiring layers 11 are exposed from recesses on the surface 12a of the first insulating layer 12. The depth or distance of the faces 11s from the surface 12a of the first insulating layer 12 may be about 5 to 15 µm. The material of the first metallic layers 11 may be copper (Cu) or the like. The thicknesses of the first wiring layers 11 are about 15 to 20 µm. The recesses 12y may be shaped like a circle in its plan view. The material of the first insulating layer 12 may be an insulating resin such as an epoxy resin and a polyimide resin. The thicknesses of the first wiring layers 12 are about 50 µm.

The first wiring layers 11 include electrode pad 11a and alignment marks 11b. The electrode pads 11a are connection terminals to be connected with various electronic parts such as a semiconductor chip, a chip capacitor, a chip resistor, and a chip inductor. The electrode pads 11a may be shaped like a circle in a plan view and have a diameter of about 50 µm.

The alignment mark 11b is used as a standard for aligning electronic components such as a semiconductor chip with the wiring substrate 10, a standard for aligning the wiring substrate 10 with another wiring substrate, or the like. The alignment mark 11b may be shaped like a circle in its plan view and the diameter of the circle may be about 0.3 mm. The alignment mark 11b may not be shaped like a circle and have an arbitrary shape such as a rectangle and a crisscross in its plan view.

The faces 11s of the first wiring layers 11 including the electrode pads 11a and the alignment mark 11b are roughened to have a predetermined surface roughness. Hereinafter, the roughened face has a surface roughness Ra greater than the 50 nm (Ra>50 nm). The faces 11s of the first wiring layers 11 including the electrode pads 11a and the alignment mark 11b are preferably roughened to have a predetermined surface roughness Ra of about 150 nm. However, the present embodiment may include when 50 nm<Ra<200 nm. A technical reason why the surface roughness Ra of the roughened faces his of the first wiring layers 11 is determined to be 50 nm<Ra<200 nm is described later.

The second interconnection patterns 13 are formed on an opposite surface 12b of the first insulating layer 12. The second wiring layers 13 are made of vias which penetrate through the first insulating layer 12, fill inside first via holes 12x, and expose upper surfaces of the vias; and an interconnection pattern formed on the surface 12b of the first insulating layer 12. The second interconnection patterns 13 are electrically connected to the electrode pads 11a exposed toward the first via holes 12x. The material of the second wiring layers 13 may be copper (Cu) or the like. The thicknesses of the second wiring layers 13 may be about 15 to 20 µm.

The second insulating layer 14 is formed to cover the second wiring layers 13 on the first insulating layer 12. The material of the second insulating layer 14 may be an epoxy resin or a polyimide resin. The thickness of the second insulating layer 14 is about 50 µm.

The third wiring layers 15 are formed on the second insulating layer 14. The third wiring layers 15 are made of vias which penetrate through the second insulating layer 14, fill inside second via holes 14x, and expose upper surfaces of the vias; and an interconnection pattern formed on the surface of the second insulating layer 14. The third interconnection patterns 15 are electrically connected to the second wiring layers 13 exposed toward the second via holes 14x. The material of the third wiring layers 15 is copper (Cu) or the like. The thicknesses of the third wiring layers 15 may be about 15 to 20 μm.

The third insulating layer 16 is formed to cover the third wiring layers 15 on the second insulating layer 14. The material of the third insulating layer 16 may be an epoxy or polyimide resin. The thickness of the third insulating layer 16 is about 50 μm.

The fourth wiring layers 17 are formed on the third insulating layer 16. The fourth wiring layers 17 are made of vias which penetrate through the third insulating layer 16, fill inside third via holes 16x, and expose upper surfaces of the vias; and an interconnection pattern formed on the third insulating layer 16. The fourth wiring layers 17 are electrically connected to the third wiring layers 15 exposed toward the third via holes 16x. The material of the fourth wiring layers 17 may be copper (Cu) or the like. The thicknesses of the fourth wiring layers 17 may be about 15 to 20 μm.

The solder resist layer 18 is formed to cover the fourth wiring layers 17 on the third insulating layer 16. The solder resist layer 18 has opening portions 18x, and parts of the fourth wiring layers 17 are exposed toward insides of the opening portions 18x of the solder resist layer 18. The material of the solder resist layer 18 may be a photo-sensitive resin material including an epoxy or imide resin or the like. The thickness of the solder resist layer 18 may be about 50 μm.

When necessary, metallic layers or the like may be formed on the fourth wiring layers 17 which are exposed toward insides of the opening portions 18x. Examples of the metallic layer are an Au layer; a Ni/Au layer which is a metallic layer formed by laminating a Ni layer and an Au layer in this order; and a Ni/Pd/Au layer which is a metallic layer formed by laminating a Ni layer, a Pd layer, and an Au layer in this order.

External connection terminals such as a solder ball or a lead pin may be formed on the fourth wiring layers 17 which are exposed toward insides of the opening portions 18x of the solder resist layer 18 or on the metallic layer when the metallic layers are formed on the fourth wiring layers 17. The externally connecting terminals are electrically connected to the pads provided in a mounting board (not illustrated) such as a motherboard, and can be formed when necessary.

[The Manufacturing Method of a Wiring Substrate of Embodiment 1]

Next, the manufacturing method of the wiring substrate of Embodiment 1 is described. FIG. 8 to FIG. 20 illustrate manufacturing steps using cross-sectional views of the wiring substrate of Embodiment 1. In FIG. 8 to FIG. 20, the same reference symbols are attached to the same parts as those in FIG. 7 and descriptions of these parts are omitted.

Figure 8:
FIG. 8 illustrates a first manufacturing step using a cross-sectional view of the wiring substrate of Embodiment 1.

Referring to FIG. 8, a supporting body 21 is prepared. The supporting body 21 is a silicon plate, a glass plate, a metallic plate, a metallic foil, or the like. A copper foil is used as the supporting body 21. This is because the supporting body is used as a power supply layer for electrolytic plating in the step illustrated in FIG. 10. The supporting body can be easily removed in the step illustrated in FIG. 17. The thickness of the supporting body 21 may be about 35 to 100 μm.

Figure 9:
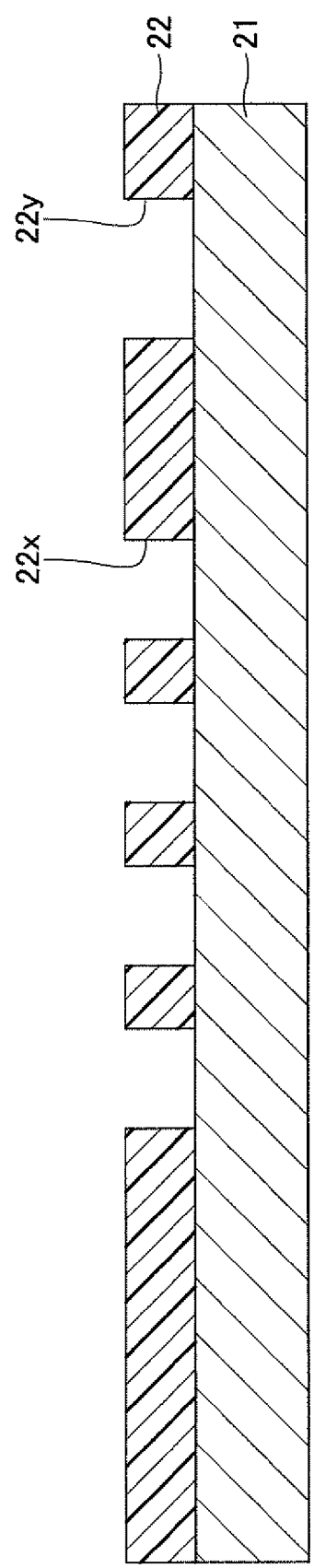
FIG. 9 illustrates a second manufacturing step using a cross-sectional view of the wiring substrate of Embodiment 1.

Referring to FIG. 9, a resist layer 22 having opening portions 22x corresponding to positions of forming electrode pads 11a included in the first wiring layers 11 and an opening portion 22y corresponding to a position of forming alignment mark 11b included in the first wiring layers 11 is formed. The thickness of the resist layer 22 may be about 30 to 50 μm.

Specifically, a liquid or paste resist made of a photo-sensitive resin material containing an epoxy or imide resin or the like is coated on one surface of the supporting body 21. Alternatively, a film resist such as a dry film resist made of a photo-sensitive resin material containing an epoxy or imide resin or the like is laminated on one surface of the supporting body 21. By exposing the resist layer 22 with light and developing the coated or laminated resist, opening portions 22x and 22y are formed. With this, the resist layer 22 having the opening portions 22x and 22y is formed. It is possible to laminate a film resist having the opening portions 22x and 22y on the one surface of the supporting body 21.

The opening portions 22x are formed at the positions corresponding to the electrode pad 11a included in the first wiring layers 11. Pitches disposing the electrode pads may be about 100 μm. The opening portions 22x may be shaped like a circle in a plan view and have a diameter of about 50 μm. The opening portion 22y may be shaped like a circle in a plan view and have a diameter of about 0.3 mm. The alignment mark 11b may not be shaped like a circle in a plan view and have an arbitrary shape such as a rectangle and a crisscross in its plan view.

Figure 10:
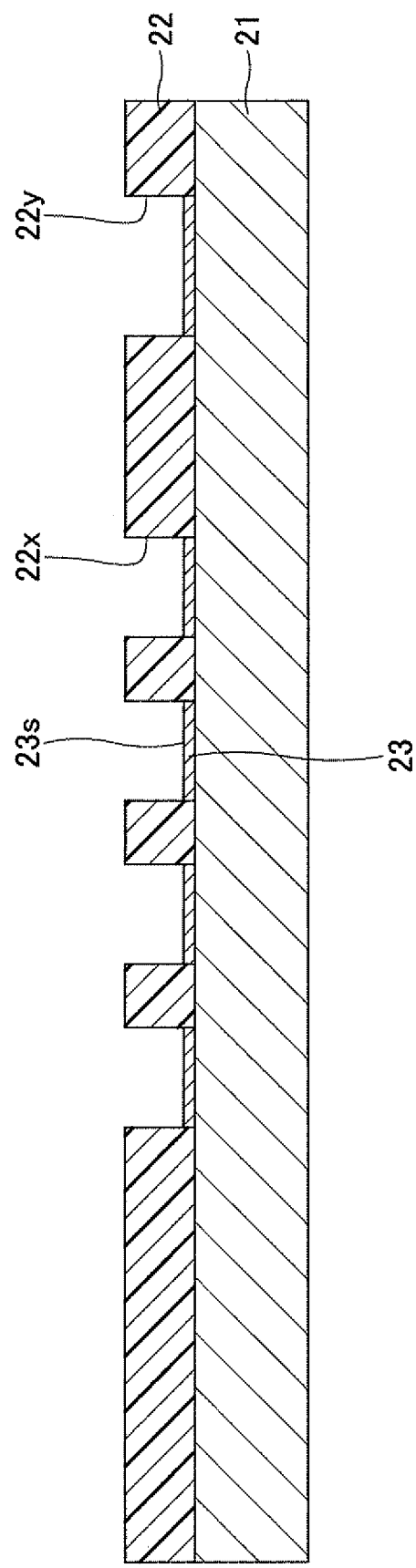
FIG. 10 illustrates a third manufacturing step using a cross-sectional view of the wiring substrate of Embodiment 1.

Referring to FIG. 10, the metallic layers 23 are formed on the one surface of the supporting body 21 and insides of the opening portions 22x and 22y by electrolytic plating in which the supporting body 21 is used as the power supplying layer. The metallic layers 23 are provided to prevent the first wiring layers 11 from being removed at a time when the supporting body 21 is removed in the step illustrated in FIG. 17 described later. The metallic layers 23 function as an etching stop layer. The material of the metallic layers 23 is not removed by an etching solution for removing the supporting body 21.

Specifically, since the copper foil is used as the supporting body 21 in Embodiment 1, the material of the metallic layers 23 is nickel (Ni) which cannot be removed by the etching liquid for removing copper (Cu). The metallic layers 23 made of nickel (Ni) can be formed by electrolytic plating in a Nickel Sulphone bath as a plating bath. The faces 23s of the metallic layers 23 made of nickel (Ni) formed by electrolytic plating in the Nickel Sulphone bath as the plating bath are flat. Hereinafter, a flat face has a surface roughness Ra of 50 nm or less (Ra≦50 nm). However, the metallic layers 23 may be a material other than nickel (Ni) if the metallic layers 23 cannot be removed by the etching liquid for removing the copper (Cu). The thickness of the resist layer 23 may be about 5 to 15 μm.

Figure 11:
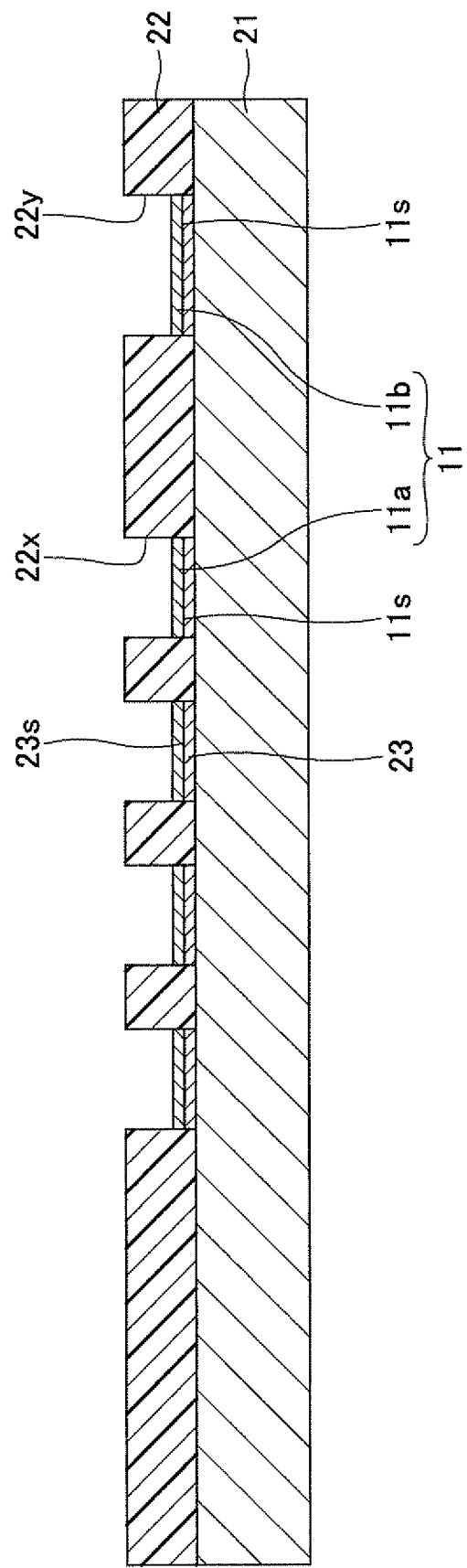
FIG. 11 illustrates a fourth manufacturing step using a cross-sectional view of the wiring substrate of Embodiment 1.

Referring to FIG. 11, the first wiring layers 11 are formed on the faces 23s of the metallic layers 23 inside the opening portions 22x and 22y by electrolytic plating in which the supporting body 21 is used as the power supplying layer. The material of the first metallic layers 11 may be copper (Cu) or the like. The thicknesses of the first wiring layers 11 are about 15 to 20 μm. The first wiring layers 11 include the electrode pads 11a and the alignment mark 11b. The electrode pads 11a are used as connection terminals connected to a semiconductor chip. The alignment mark 11b is used as a standard for aligning electronic components such as the semiconductor chip with the wiring substrate 10, a standard for aligning the wiring substrate 10 with another wiring substrate, or the like. As described, the electrode pads 11a and the alignment mark 11b are formed in the same step.

Figure 12:
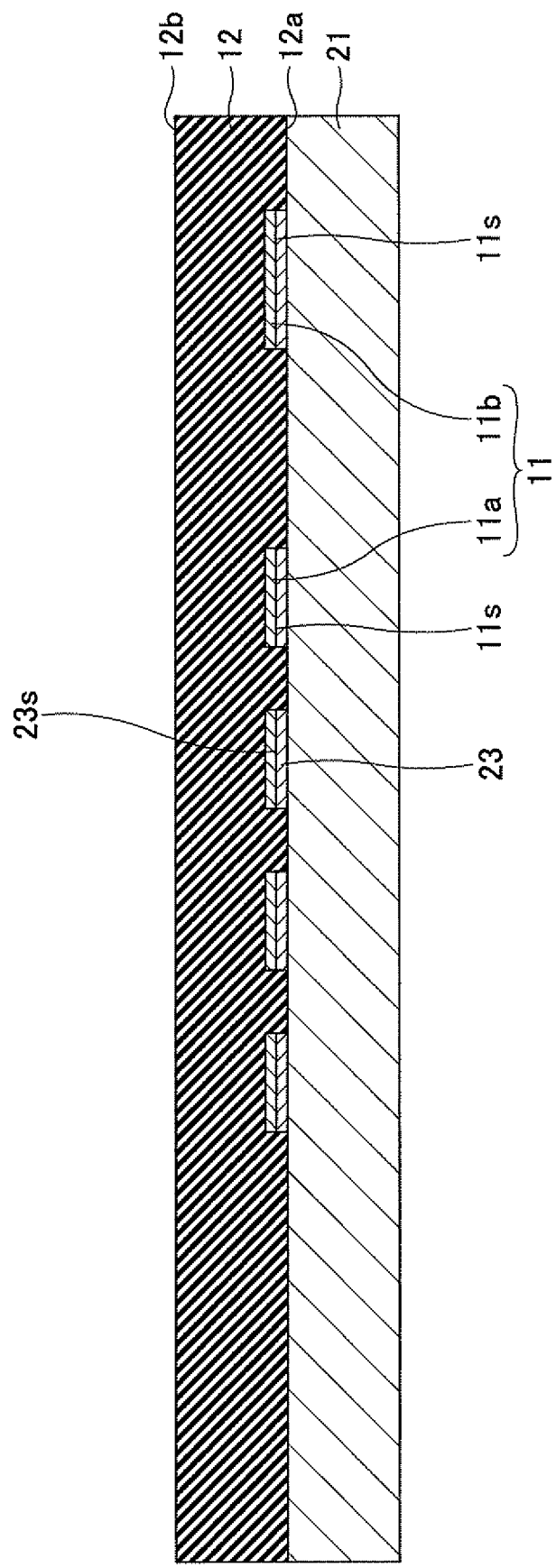
FIG. 12 illustrates a fifth manufacturing step using a cross-sectional view of the wiring substrate of Embodiment 1.

Referring to FIG. 12, after removing the resist layer 22 illustrated in FIG. 11, the first insulating layer 12 is formed so as to cover the metallic layers 23, the first wiring layers 11, and the surface of the supporting body 21. The material of the first insulating resin layer 12 may be a thermosetting film-like epoxy or polyimide resin or a thermosetting liquid-like or paste-like epoxy or polyimide resin. The first insulating layer 12 is preferably a resin material containing a filler and having good workability to enable easily forming the first via holes 12x by a laser processing method or the like in the steps described below. The thickness of the first insulating layer 12 is about 50 μm.

When the film-like epoxy or polyimide resin, the thermosetting liquid-like or paste-like epoxy or polyimide resin, or the like is used as the material of the first insulating layer 12, the film-like first insulating layer 12 may be laminated on the surface of the supporting body 21 so as to cover the metallic layers 23 and the first wiring layers 11. After pressing the laminated first insulating layer 12, the first insulating layer 12 is heated at a curing temperature or higher and cured or hardened. It is possible to prevent voids from forming by laminating the first insulating layer 12 under a vacuum atmosphere.

When the thermosetting liquid-like or paste-like epoxy or polyimide resin is used as the material of the first insulating layer 12, the liquid-like or paste-like first insulating layer 12 may be coated by, for example, a spin coating method or the like so as to cover the metallic layers 23 and the first wiring layers 11. The coated first insulating layer 12 is heated at the curing temperature or more to harden the first insulating layer 12.

Figure 13:
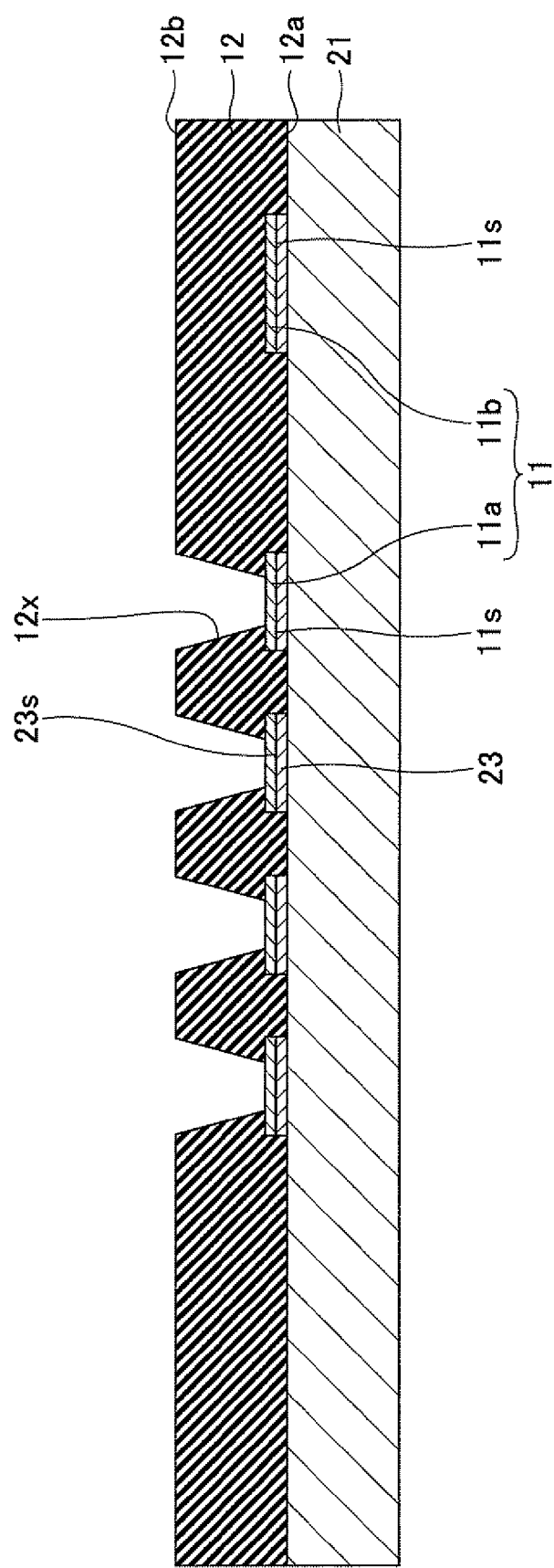
FIG. 13 illustrates a sixth manufacturing step using a cross-sectional view of the wiring substrate of Embodiment 1.

Referring to FIG. 13, first via holes 12x, which penetrate the first insulating layer 12 and from which the faces of the first wiring layers 11 are exposed, are formed. The first via holes 12x may be formed by a laser processing using, for example, $CO_2$ laser. The first via holes 12x may be formed by using a photo-sensitive resin for the first insulating layer 12, and patterning the first insulating layer 12 with photolithography. The first via holes 12x may be formed by printing the liquid-like or paste-like resin through the screen mask which masks a position corresponding to the first via holes 12x and curing the liquid-like or paste-like resin.

Figure 14:
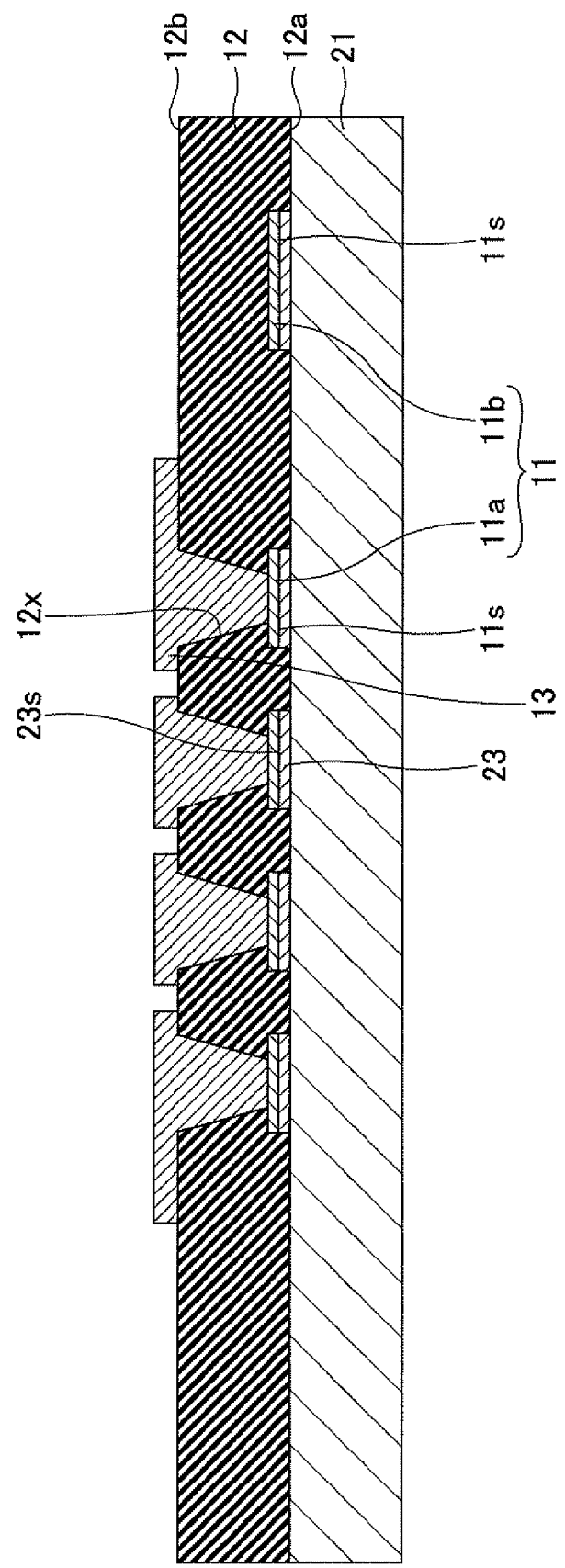
FIG. 14 illustrates a seventh manufacturing step using a cross-sectional view of the wiring substrate of Embodiment 1.

Referring to FIG. 14, the second wiring layers 13 are formed on the surface 12b of the first insulating layer 12. The second wiring layers 13 include vias filling inside the first via holes 12x and an interconnection pattern formed on the face 12b of the first insulating layer 12. The interconnection patterns 13 of the second wiring layers are electrically connected to the electrode pads 11a of the first wiring layers 11 exposed toward the first via holes 12x. The material of the second wiring layers 13 may be copper (Cu) or the like.

The second wiring layers 13 may be formed by various wiring forming methods such as a semi-additive method and a subtractive method. As an example, a method of forming the second wiring layers 13 using the semi-additive method as an example is described next.

First, a seed layer (not illustrated) made of copper (Cu) or the like is formed on upper faces of the electrode pads 11a of the first wiring layers 11 exposed inside the first via holes 12x and on the first insulating layer 12 including inner walls of the first via holes 12x by a electroless plating or sputtering method. Further, a resist layer (not illustrated) having opening portions corresponding to the second wiring layers 13 is formed on the seed layer. A wiring layer (not illustrated) made of copper (Cu) is formed on the opening portions of the resist layer by the electrolytic plating in which the seed later is used as the power supplying layer. Subsequently, after removing the resist layer, portions of the seed layer which are not covered by the wiring layer are removed by etching using the wiring layer as a mask. With this, the second wiring layers 13 including the vias filling inside the first via holes 12x and the interconnection pattern formed on the first insulating layer 12 are formed on the first insulating layer 12.

Figure 15:
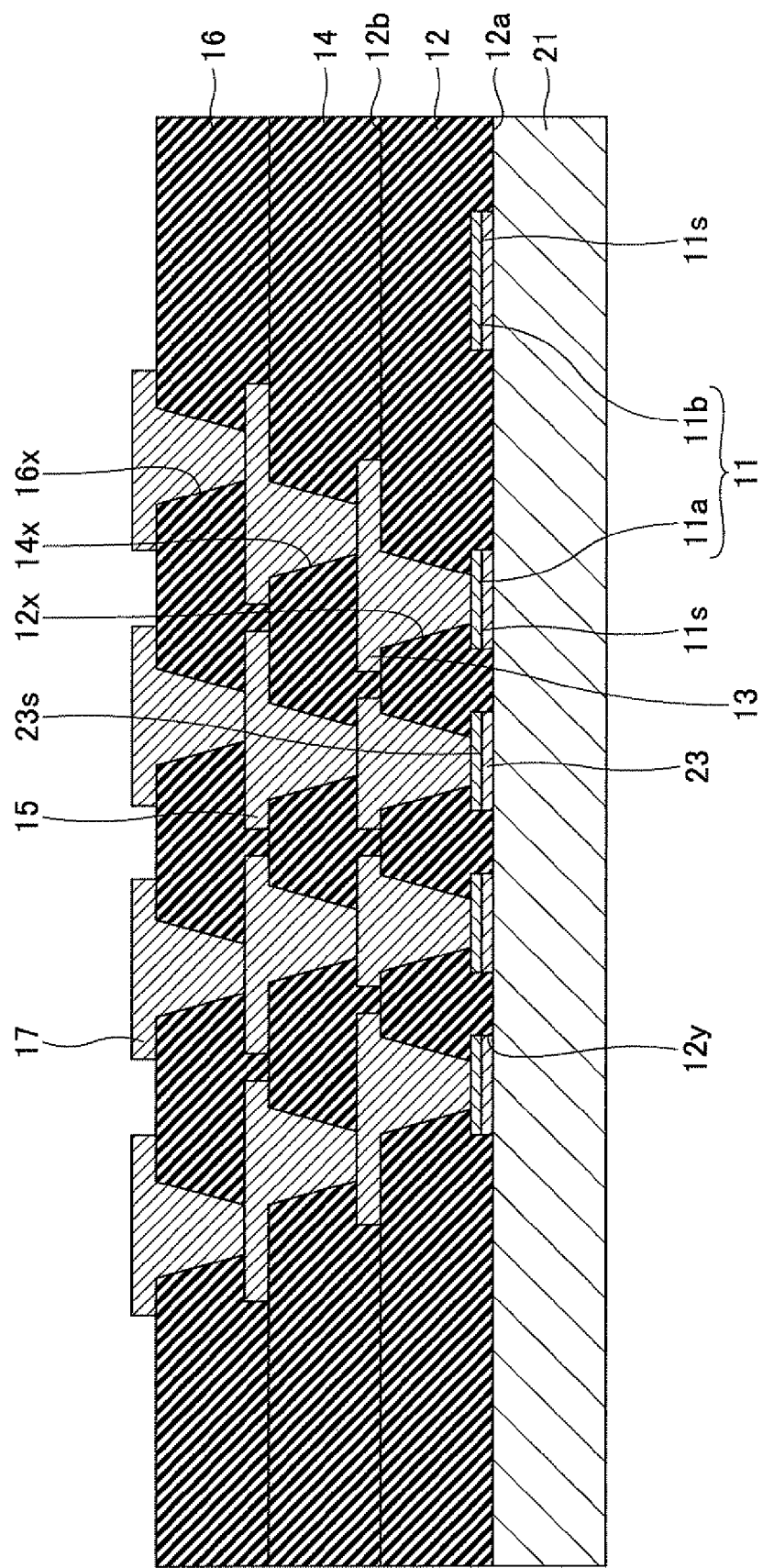
FIG. 15 illustrates an eighth manufacturing step using a cross-sectional view of the wiring substrate of Embodiment 1.

Referring to FIG. 15, by repeating steps similar to the above steps, the second insulating layer 14, the third wiring layers 15, the third insulating layer 16, and the fourth wiring layers 17 are laminated. Said differently, after forming the second insulating layer 14 covering the second wiring layers 13 on the face 12b of the first insulating layer 12, second via holes 14x are formed at portions of the second insulating layer 14 on the second wiring layers 13. The material of the second insulating resin layer 14 may be a thermosetting film-like epoxy or polyimide resin or a thermosetting liquid-like or paste-like epoxy or polyimide resin.

Further, the third wiring layers 15 to be connected to the second wiring layers 13 are formed on the second insulating layer 14 via the second via holes 14x. The material of the third wiring layers 15 is copper (Cu) or the like. The third wiring layers 15 may be formed by the semi-additive method.

After forming the third insulating layer 16 covering the third wiring layers 15 on the second insulating layer 14, third via holes 16x are formed in portions of the third insulating layer 16 on the third wiring layers 15. Further, the fourth wiring layers 17 to be connected to the third wiring layers 15 are formed on the third insulating layer 16 via the third via holes 16x. The material of the third insulating resin layer 16 may be a thermosetting film-like epoxy or polyimide resin or a thermosetting liquid-like or paste-like epoxy or polyimide resin. The material of the fourth wiring layers 17 is copper (Cu) or the like. The fourth wiring layers 17 may be formed by the semi-additive method.

As described, a predetermined build-up wiring layer is formed on the surface of the supporting body 21. With Embodiment 1, the three-layered build-up wiring, including the second wiring layers 13, the third wiring layers 15, and the fourth wiring layers 17, is formed. It is possible to form a n-layered build-up wiring layer (n is an integer of 1 or more).

Figure 16:
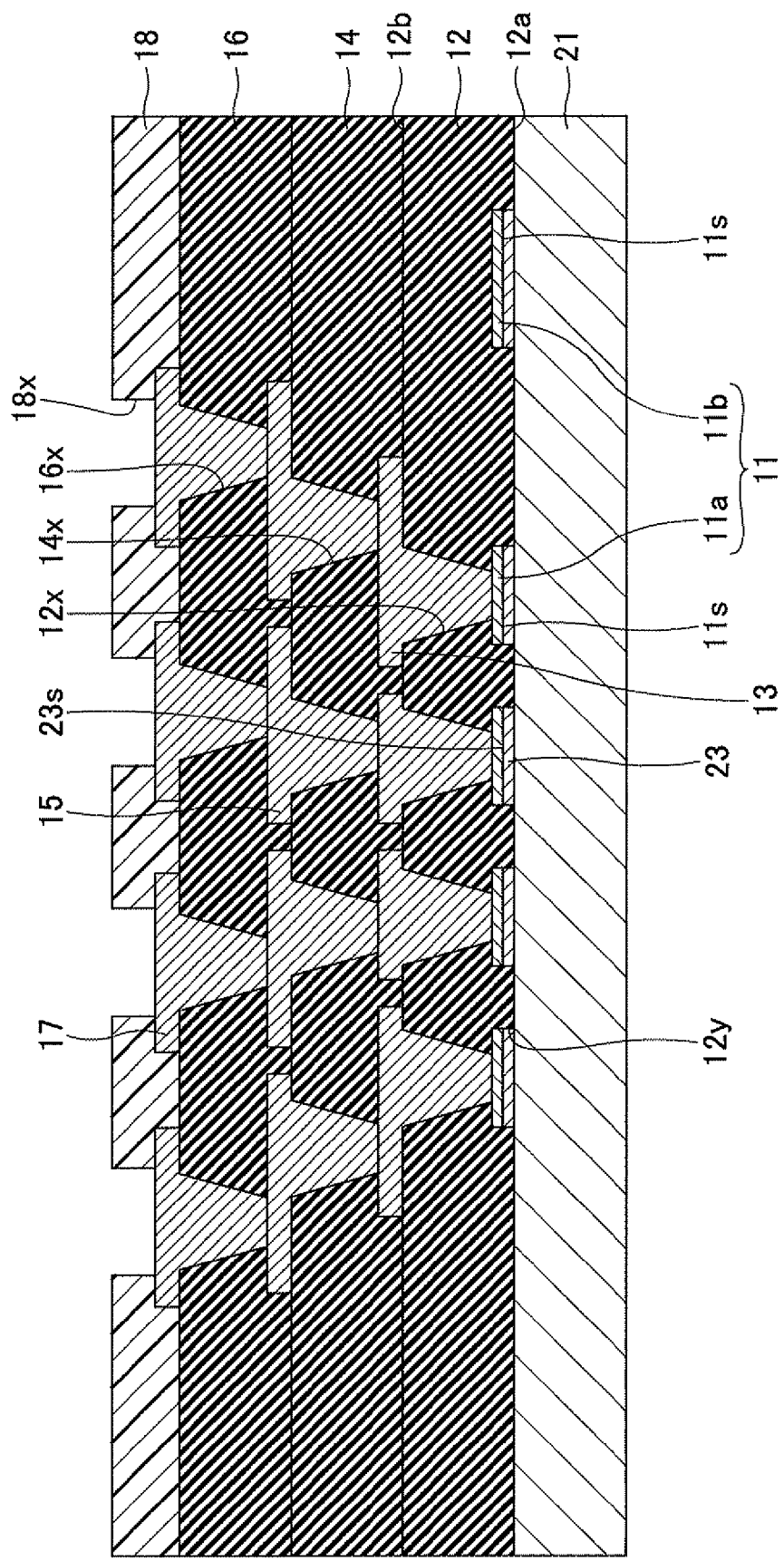
FIG. 16 illustrates a ninth manufacturing step using a cross-sectional view of the wiring substrate of Embodiment 1.

Referring to FIG. 16, the solder resist layer 18 having opening portions 18x is formed to cover the fourth wiring layers 17 on the third insulating layer 16. Specifically, a solder resist made of a photo-sensitive resin material such as an epoxy or imide resin is coated on the third insulating layer 16 to cover the fourth wiring layers 17. By exposing the coated solder resist with light and developing the coated solder resist, the opening portions 18x are formed. With this the solder resist layer 18 having the opening portions 18x is formed. The parts of the fourth wiring layers 17 are exposed inside the opening portions 18x of the solder resist layer 18. The fourth wiring layers 17 exposed inside the opening portions 18x function as electrode pads for electrically connecting to pads installed in an mounting board (not illustrated) such as a motherboard.

When necessary, metallic layers or the like may be formed on the fourth wiring layers 17 which are exposed toward insides of the opening portions 18x. Examples of the metallic layer are an Au layer; a Ni/Au layer which is a metallic layer formed by laminating a Ni layer and an Au layer in this order; and a Ni/Pd/Au layer which is a metallic layer formed by laminating a Ni layer, a Pd layer, and an Au layer in this order.

Figure 17:
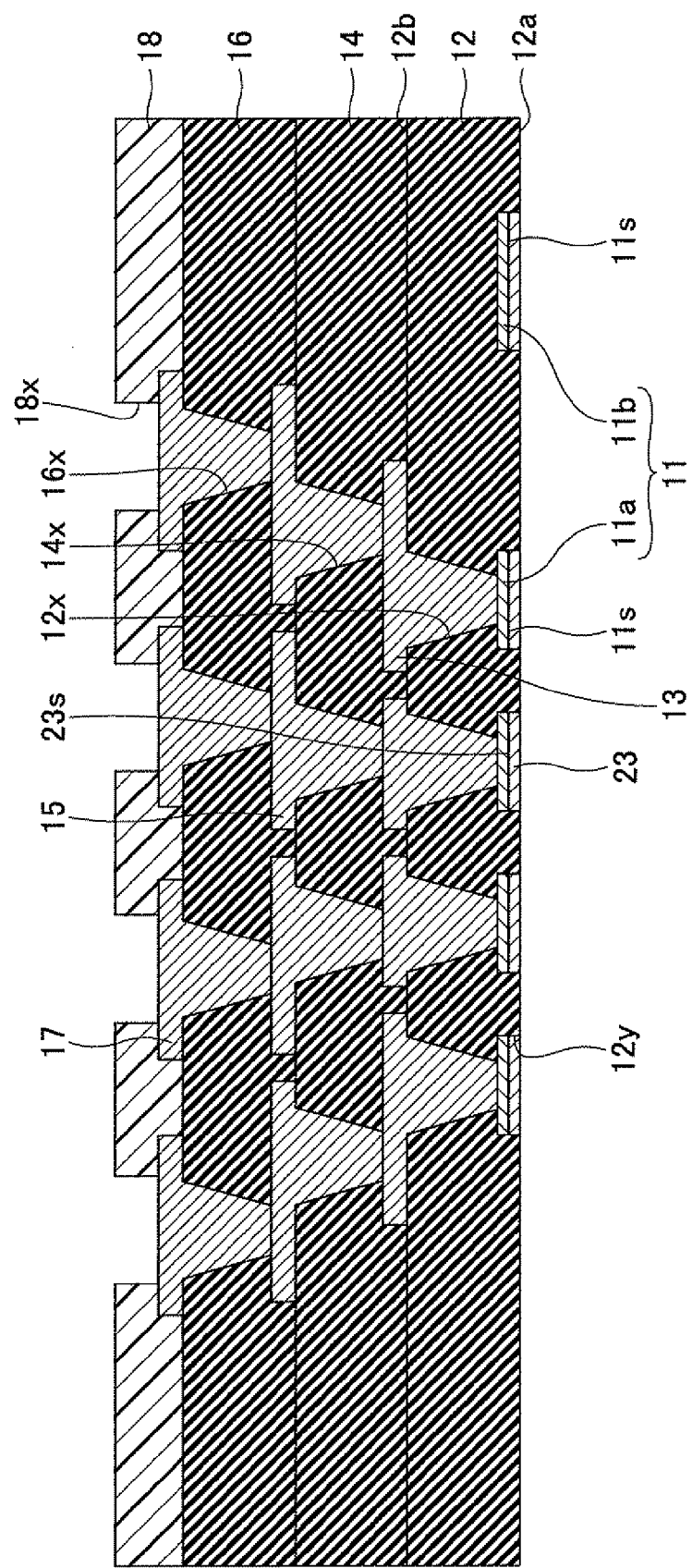
FIG. 17 illustrates a tenth manufacturing step using a cross-sectional view of the wiring substrate of Embodiment 1.

The supporting body 21 illustrated in FIG. 16 is removed in the step illustrated in FIG. 17. The supporting body 21 made of the copper foil may be removed by wet etching using aqueous ferric chloride, aqueous copper chloride, aqueous ammonium persulfate, or the like. At this time, since the metallic layers 23 are made of nickel (Ni), the metallic layers 23 function as etching stop layers. Therefore, the supporting body 21 is selectively etched to be removed. With this step, the other faces of the metallic layers 23 opposite to the faces 23s are exposed from the first insulating layer 12. When the fourth wiring layers 17 are made of copper (Cu), the fourth wiring layer 17 are prevented from being etched together with the supporting body 21 by masking the fourth wiring layers 17.

Figure 18:
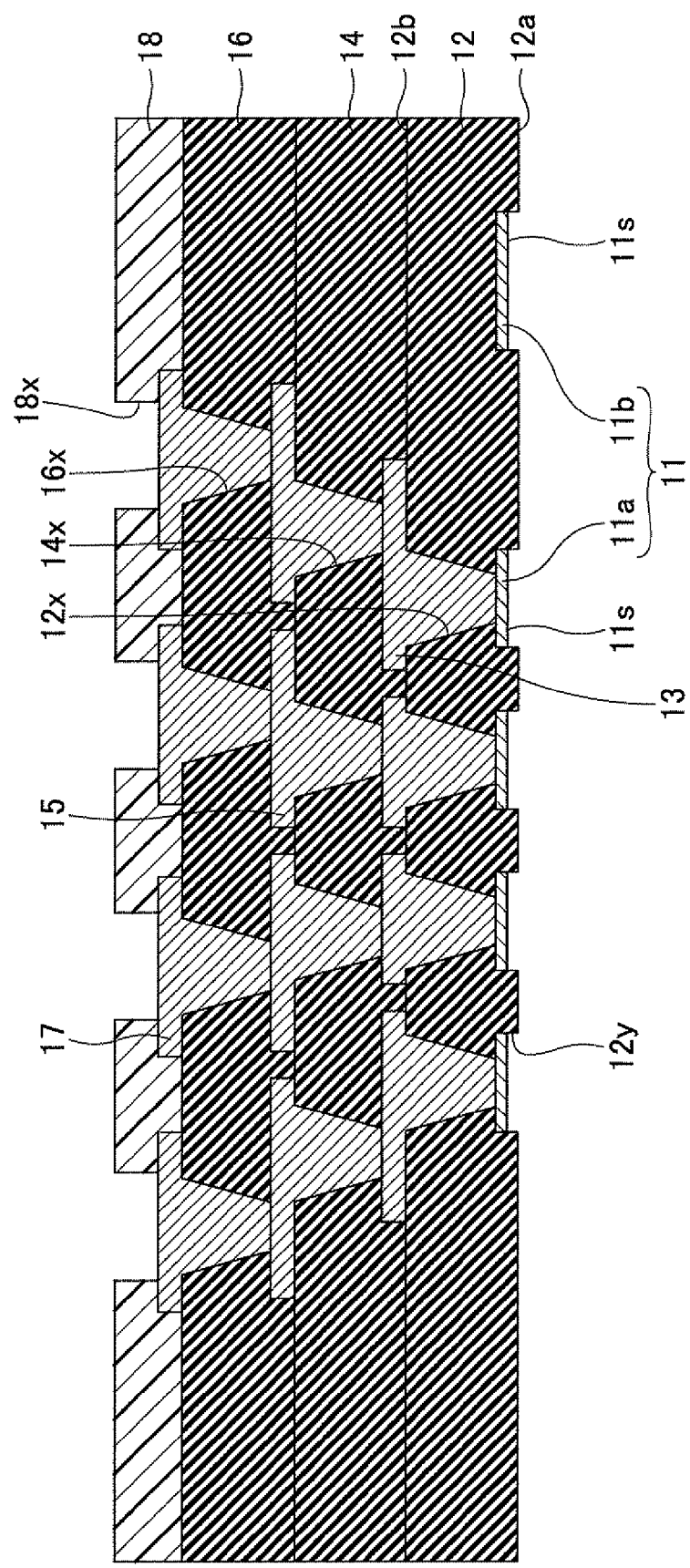
FIG. 18 illustrates an eleventh manufacturing step using a cross-sectional view of the wiring substrate of Embodiment 1.

The metallic layers 23 illustrated in FIG. 17 are removed in the step illustrated in FIG. 18. The metallic layers 23 made of nickel may be removed by wet etching using Nickel remover NH1860 manufactured by MEC Co., Ltd. or the like. With this step, the faces 11s of the first wiring layers 11 are exposed at positions recessed from the surface 12a of the first insulating layer 12 inside the recesses 12y formed on the surface 12a of the first insulating layer 12. The depth or distance of the faces 11s from the surface 12a of the first insulating layer 12 may be about 5 to 15 µm. As described, since the faces 23s of the metallic layers 23 are flat, faces 11s of the first wiring layers 11 including the electrode pads 11a and the alignment mark 11b which are in contact with the faces 23a of the metallic layer 23 are also flat.

Figure 19:
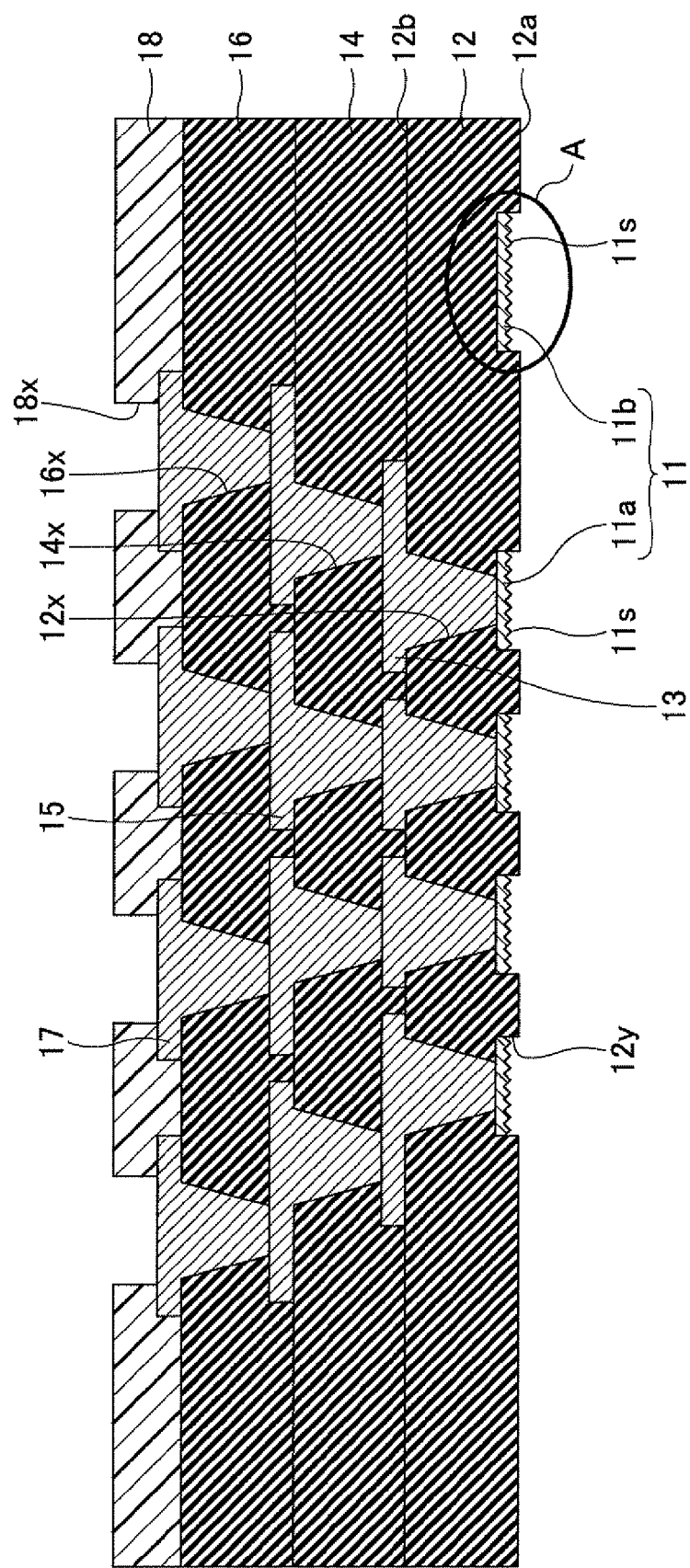
FIG. 19 illustrates a twelfth manufacturing step using a cross-sectional view of the wiring substrate of Embodiment 1.
Figure 20:
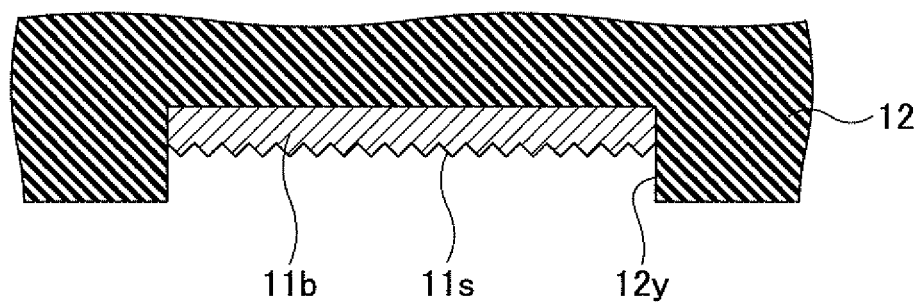
FIG. 20 illustrates a thirteenth manufacturing step using a cross-sectional view of the wiring substrate of Embodiment 1.

Referring to FIG. 19 and FIG. 20, the faces 11s of the first wiring layers 11 including the electrode pads 11a and the alignment mark 11b are roughened to have a predetermined surface roughness. With this the wiring substrate 10 illustrated in FIG. 7 is completed. FIG. 20 is an enlarged cross-sectional view of a circle A of FIG. 19. It is preferable that the predetermined surface roughness of the faces 11s of the first wiring layers 11 is about 150 nm (Ra=150 nm). However, a range of 50 nm<Ra<200 nm is acceptable. The faces 11s of the first wiring layers 11 may be a roughened face having a predetermined surface roughness of 50 nm<Ra<200 nm. This predetermined surface roughness is obtainable by wet etching using a solution containing an organic acid such as a formic acid, a blast process while masking a portion other than the face 11s of the first wiring layers 11, or the like.

The blast process is to mechanically adjust surface roughness of a processed material by blowing an abrading agent against the processed material with a high pressure. The blast process includes an air blast process, a shot blast process, a wet blast process, or the like. It is preferable to use the wet blast process. The wet blast process is carried out by dispersing an abrading agent such as alumina abrasive grains and spherical silica abrasive grains to cause the abrading agent to crash into an object to be processed thereby abrading minute regions. With the wet blast process, abrading can be very delicately carried out without causing damage in comparison with the air blast process and the shot blast process. Further, since the abrading agent is dispersed into the solution such as water, the abrading agent does not fly apart in the air as particles although the abrading agent flies apart in the air as particles in the air blast process and the shot blast process.

Figure 21:
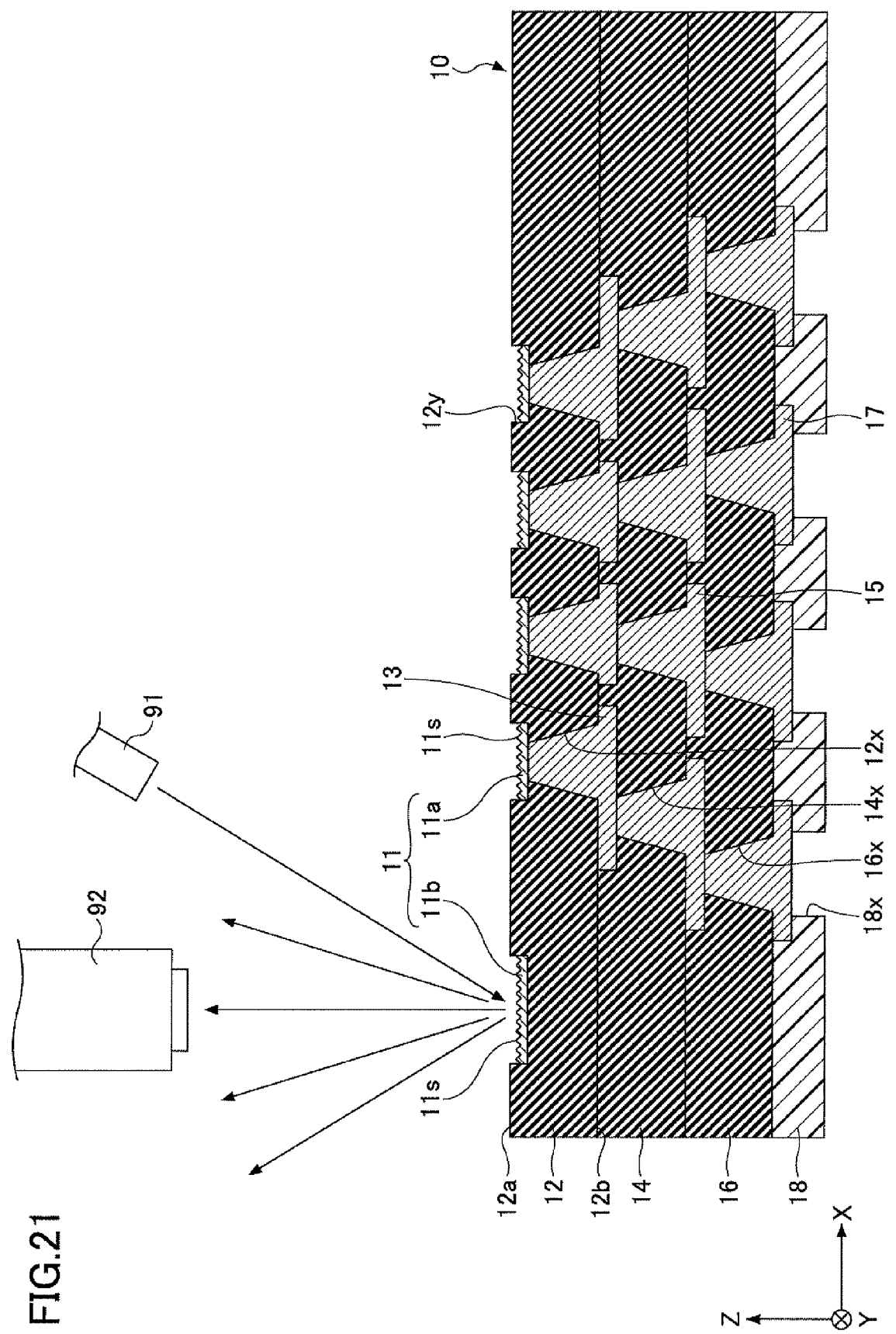
FIG. 21 illustrates reflection of light by an alignment mark of Embodiment 1.

The technical meaning in which the faces 11s of the first wiring layers 11 are roughened is described. FIG. 21 illustrates reflection of light by the alignment mark 11b of Embodiment 1. Referring to FIG. 21, the same reference symbols are attached to the same parts as those in FIG. 7, and descriptions of these parts are omitted. FIG. 21 illustrates a cross-sectional view of the wiring substrate 10 viewed from the opposite side of the wiring substrate illustrated in FIG. 7. The electrode pads 11a are used as connection terminals connected to the semiconductor chip (not illustrated). The semiconductor chip is installed on the side of the electrode pads 11a of the wiring substrate 10 while aligning the semiconductor chip with the wiring substrate 10.

Referring to FIG. 21, when the semiconductor chip (not illustrated) is aligned with the wiring substrate 10, a light source 91 irradiates visible light or the like on a face his of the alignment mark 11b. The light reflected on the face 11s is received by a light receiving unit 92 of a CCD camera or the like to thereby recognize the alignment mark 11b. Based on the recognized alignment mark 11b, the semiconductor chip is aligned with the wiring substrate 10. Since it is necessary to arrange the light source 91 at a position in which the light receiving unit 92 does not obstruct the light source 91, the irradiating light may obliquely impinge on the face 11s of the alignment mark.

Since the face 11s of the alignment mark 11b is roughened, the irradiating light from the light source 91 is reflected diffusely on the face 11s, unlike a case where the face 11s of the alignment mark 11b is flat. Therefore, most of the irradiating light reflects in a direction of the light receiving unit 92 and impinges upon the light receiving unit 92. Therefore, the alignment mark 11b can be easily recognized. When the alignment mark 11b is recognized, the semiconductor chip can be properly installed at the correct position in the wiring substrate 10.

When the irradiating light striking the face 11s of the alignment mark 11b is reflected diffusely, the surface roughness Ra of the face 11s of the alignment mark 11b is preferably about 150 nm. However, a range of 50 nm<Ra<200 nm is acceptable.

When the surface roughness Ra of the face 11s of the alignment mark 11b is 50 nm or less (Ra 50 nm), i.e. the face 11s of the alignment mark 11b is flat, the irradiating light from the light source 91 scarcely undergoes diffused reflection on the face 11s. Therefore, most of the irradiating light from the light source 91 does not impinge on the light receiving unit 92, thereby making it difficult to recognize the alignment mark 11b.

On the other hand, when the surface roughness Ra of the face 11s of the alignment mark 11b is 200 nm or more (Ra≧200 nm), it becomes difficult to recognize the alignment mark 11b due to the following reason. The irradiating light from the light source 91 is excessively diffused, and the reflection light from the alignment mark 11b is weakened to be substantially similar to the strength of reflection light from the surface 12a of the first insulating layer 12. Then, a difference between the strengths of the reflection lights from the alignment mark 11b and the face 12a becomes small. As described, the surface roughness Ra of the face 11s of the alignment mark 11b is preferably in the range of 50 nm<Ra<200 nm.

It is also preferable to change the surface roughness Ra of the surface 12a of the first insulating layer 12 to be different from the surface roughness Ra of the alignment mark 11b of the first insulating layer 12. In this case, the alignment mark 11b becomes more easily detectable than a case where the surface roughness's Ra of the face 12a and the alignment mark 11b are the same. In this, whether the surface roughness Ra of the surface 12a of the first insulating layer 12 is larger or smaller than the surface roughness Ra of the alignment mark 11b of the first insulating layer 12, the alignment mark 11b is more easily detectable. This is because only the reflected light only from the alignment mark 11b is apt to be received by the light receiving unit 92 of the CCD camera or the like.

With Embodiment 1, the roughened face of the alignment mark used for aligning the semiconductor chip with the wiring substrate is set to have the predetermined surface roughness Ra in the range of 50 nm<Ra<200 nm. Then, the irradiating light striking the alignment mark used for aligning the semiconductor chip with the wiring substrate causes diffused reflection on the roughened face of the alignment mark, and most of the irradiating light reaches the light receiving unit. As a result, the alignment mark can be easily recognized in the alignment to thereby improve the accuracy of aligning the semiconductor chip with the wiring substrate.

Embodiment 2

In Embodiment 2, another manufacturing method of the wiring substrate 10 illustrated in FIG. 7 is described. FIG. 22 to FIG. 25 illustrate manufacturing steps using cross-sectional views of the wiring substrate of Embodiment 2. In FIG. 22 to FIG. 25, the same reference symbols are attached to the same parts as those in FIG. 7, and descriptions of these parts are omitted.

Figure 22:
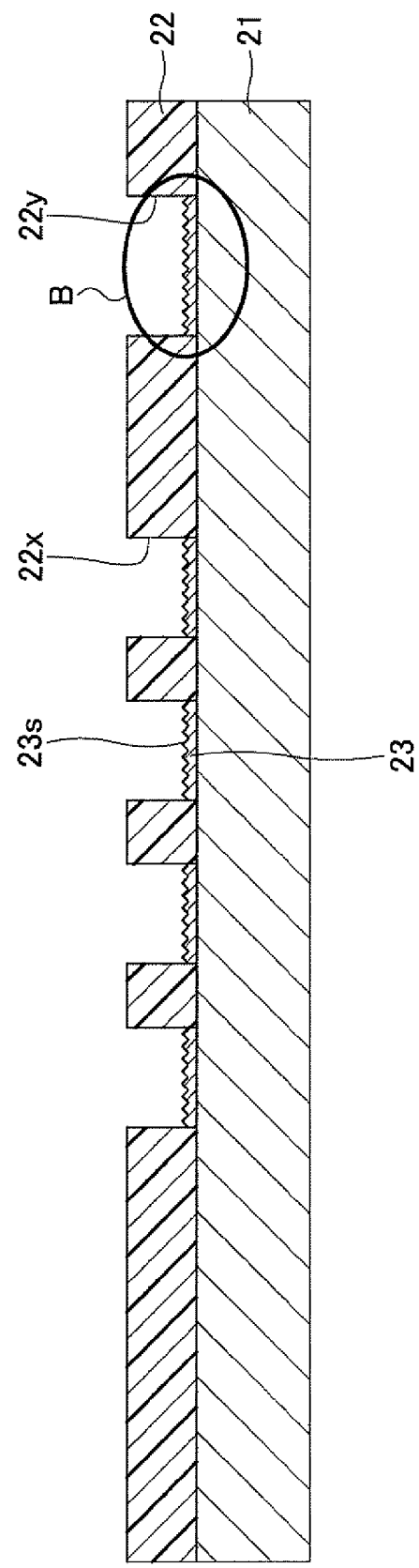
FIG. 22 illustrates a first manufacturing step using a cross-sectional view of a wiring substrate of Embodiment 2.
Figure 23:
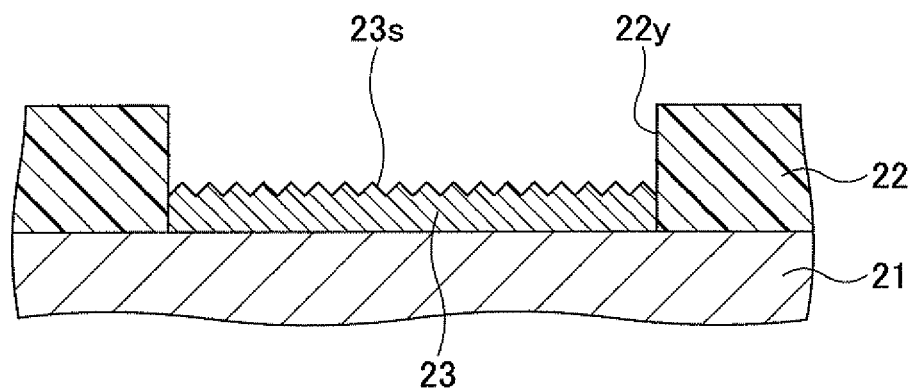
FIG. 23 illustrates a second manufacturing step using a cross-sectional view of the wiring substrate of Embodiment 2.

First, the same steps as those illustrated in FIG. 8 to FIG. 10 of Embodiment 1 are carried out. Subsequently, in steps illustrated in FIG. 22 and FIG. 23, the face 23s of the metallic layer is roughened. FIG. 23 is an enlarged cross-sectional view of a circle B of FIG. 22. The face 23s of the metallic layer 23s may be roughened to have a predetermined surface roughness by wet etching using Nickel roughening liquid NH1870 manufactured by MEC Co., Ltd. or the like. It is preferable that the predetermined surface roughness of the faces 23s of the first wiring layers 23 is about 150 nm (Ra=150 nm). However, a range of 50 nm<Ra<200 nm is acceptable.

Figure 24:
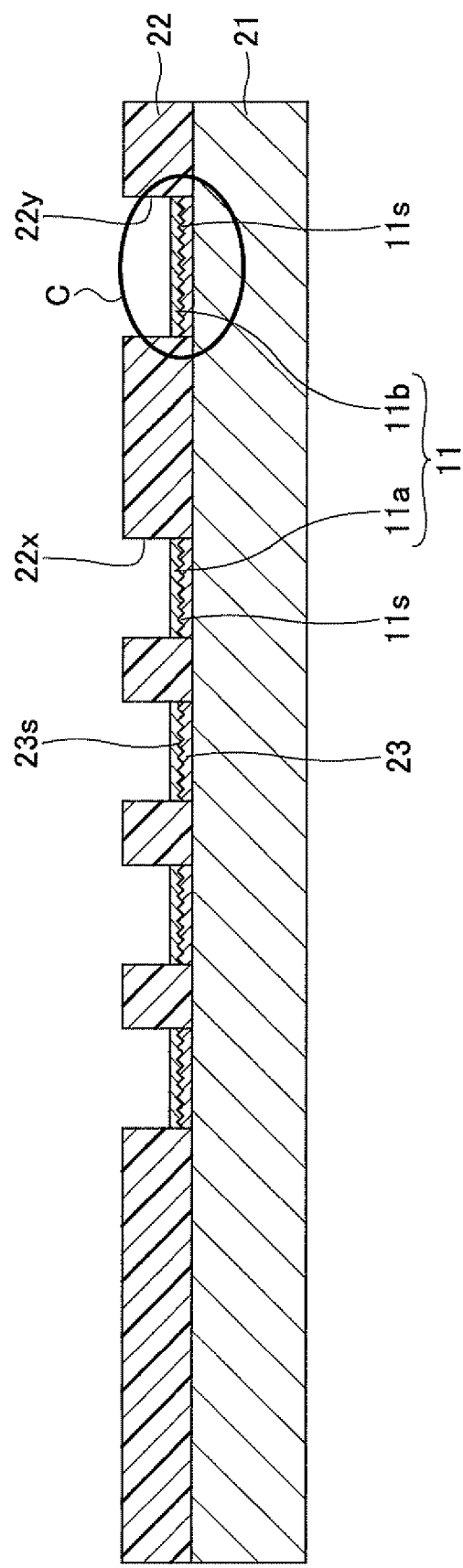
FIG. 24 illustrates a third manufacturing step using a cross-sectional view of the wiring substrate of Embodiment 2.
Figure 25:
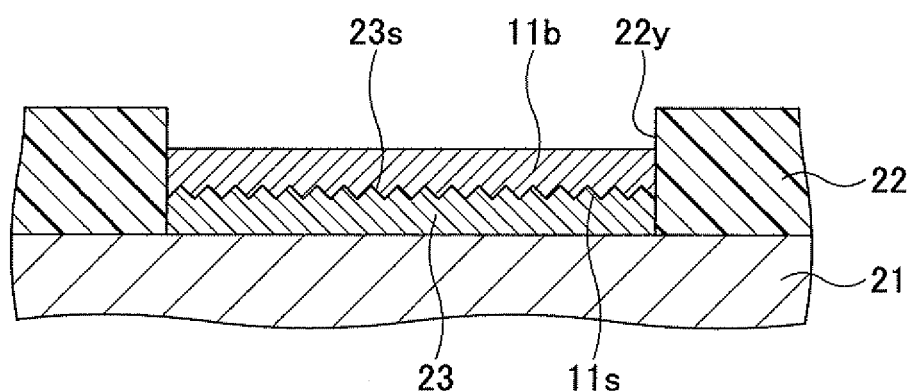
FIG. 25 illustrates a fourth manufacturing step using a cross-sectional view of the wiring substrate of Embodiment 2.

Referring to FIG. 24 and FIG. 25, the first wiring layers 11 are formed on the faces 23s of the metallic layers 23 inside the opening portions 22x and 22y by electrolytic plating in which the supporting body 21 is used as the power supplying layer. FIG. 25 is an enlarged cross-sectional view of a circle C of FIG. 24. The face 23s of the metallic layer 23 is roughened to have a predetermined surface roughness as illustrated in the steps of FIG. 22 and FIG. 23. Therefore, the roughened face having a predetermined surface roughness is transferred to the faces 11s of the first wiring layers 11 which are in contact with the faces 23s of the metallic layers 23. The surface roughnesses Ra of the faces 11s of the first wiring layers 11, including the electrode pads 11a and the alignment mark 11b, become in a range of 50 nm<Ra<200 nm in a manner similar to the surface roughness of the faces 23s of the metallic layers 23. Since details (material, thickness, and so on) of the first wiring layers 11 are similar to Embodiment 1, description of these portions is omitted.

Next, the same steps as those illustrated in FIG. 12 to FIG. 18 of Embodiment 1 are carried out. In a manner similar to the step illustrated in FIG. 18, by removing the metallic layers 23 illustrated in FIG. 24 and FIG. 25, the faces 11s of the first wiring layers 11 are recessed from the surface 12a of the first insulating layer 12. Thus, the wiring substrate 10 illustrated in FIG. 7 is completed.

According to Embodiment 2, the face of the alignment mark used for aligning the semiconductor chip with the wiring substrate is roughened by a manufacturing method different from that in Embodiment 1. Thus, a similar effect to that in Embodiment 1 is obtainable.

Embodiment 3

Figure 26:
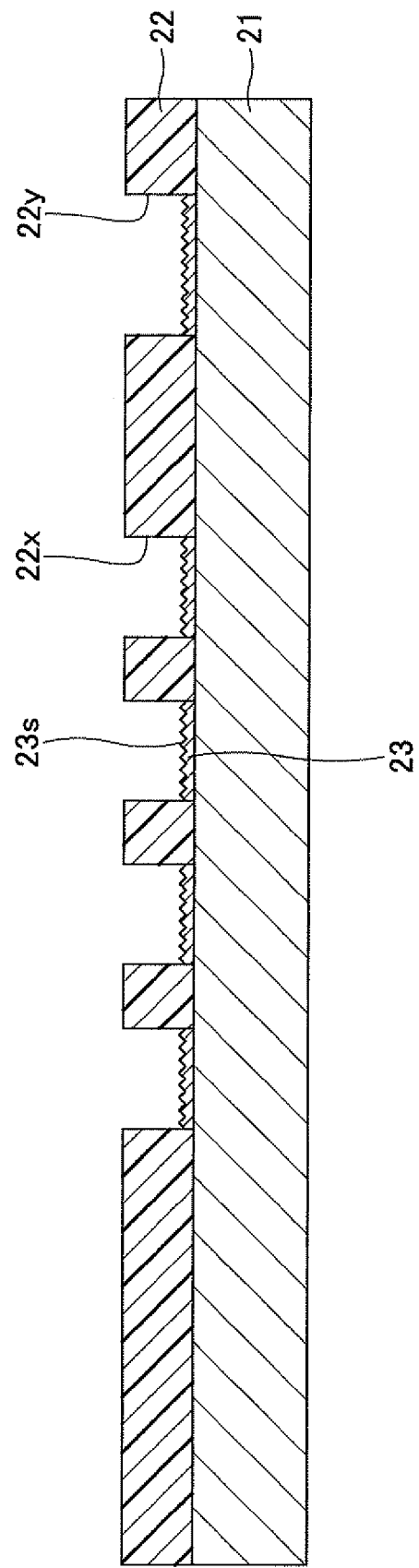
FIG. 26 illustrates a manufacturing step using a cross-sectional view of a wiring substrate of Embodiment 3.

In Embodiment 3, another manufacturing method of the wiring substrate 10 illustrated in FIG. 7 is described. FIG. 26 illustrates a manufacturing step using a cross-sectional view of a wiring substrate of Embodiment 3. Referring to FIG. 26, the same reference symbols are attached to the parts same as those in FIG. 7, and descriptions of these parts are omitted.

First, the same steps as those illustrated in FIG. 8 to FIG. 9 of Embodiment 1 are carried out. Referring to FIG. 26, the metallic layer 23 is formed on the one surface of the supporting body 21 and inside the opening portions 22x and 22y by electrolytic plating in which the supporting body 21 is used as the power supplying layer. At this time, by previously adjusting the composition of a plating solution and a current density, the faces 23s of the metallic layer 23 are roughened to have the surface roughness Ra in a range of 50 nm<Ra<200 nm. The composition of a plating solution is nickel sulfate of 264 g/l, boracic acid of 30 g/l, and nickel chloride of 50 g/l. The current density may be 0.3 to 0.4 A/dm$^2$.

As described, by appropriately adjusting the composition of the plating solution and the current density, the metallic layers 23 are formed and simultaneously the faces 23s of the metallic layers 23 are roughened to have a predetermined surface roughness in a range of 50 nm<Ra<200 nm.

Subsequently, the same steps as those in FIG. 24 and FIG. 25 of Embodiment 2 are carried out to thereby transfer the roughened faces having the predetermined surface roughness to the faces 11s of the first wiring layers 11 in contact with the face 23s of the metallic layers 23. The surface roughnesses Ra of the surfaces 11s of the first wiring layers 11 including the electrode pads 11a and the alignment mark 11b becomes in a range of 50 nm<Ra<200 nm in a manner similar to the surface roughness of the face 23s of the metallic layer 23.

Next, the same steps as those illustrated in FIG. 12 to FIG. 18 of Embodiment 1 are carried out. In a manner similar to the step illustrated in FIG. 18, by removing the metallic layers 23 illustrated in FIG. 26, the faces 11s of the first wiring layers 11 are recessed from the surface 12a of the first insulating layer 12. Thus, the wiring substrate 10 illustrated in FIG. 7 is completed.

According to Embodiment 3, the face of the alignment mark used for aligning the semiconductor chip with the wiring substrate is roughened by a manufacturing method different from that in Embodiment 1 and Embodiment 2. With this, similar effects to those in Embodiment 1 and Embodiment 2 are obtainable. Further, the following effects are obtainable.

By adjusting the composition of the plating solution used in electrolytic plating and the current density, the metallic layer is formed and simultaneously the one face of the metallic layer is roughened. As a result, the step of forming the metallic layer and the step of roughening the one face of the wiring layer of Embodiment 1, and the step of roughening the one face of the metallic layer in addition to the step of forming the metallic layer of Embodiment 2 are not provided in Embodiment 3. Therefore, the manufacturing steps of the wiring substrate are simplified.

Embodiment 4

In Embodiment 4, a method of adjusting the depths of the recesses 12y of the wiring substrate 10 illustrated in FIG. 7 is described.

Figure 27:
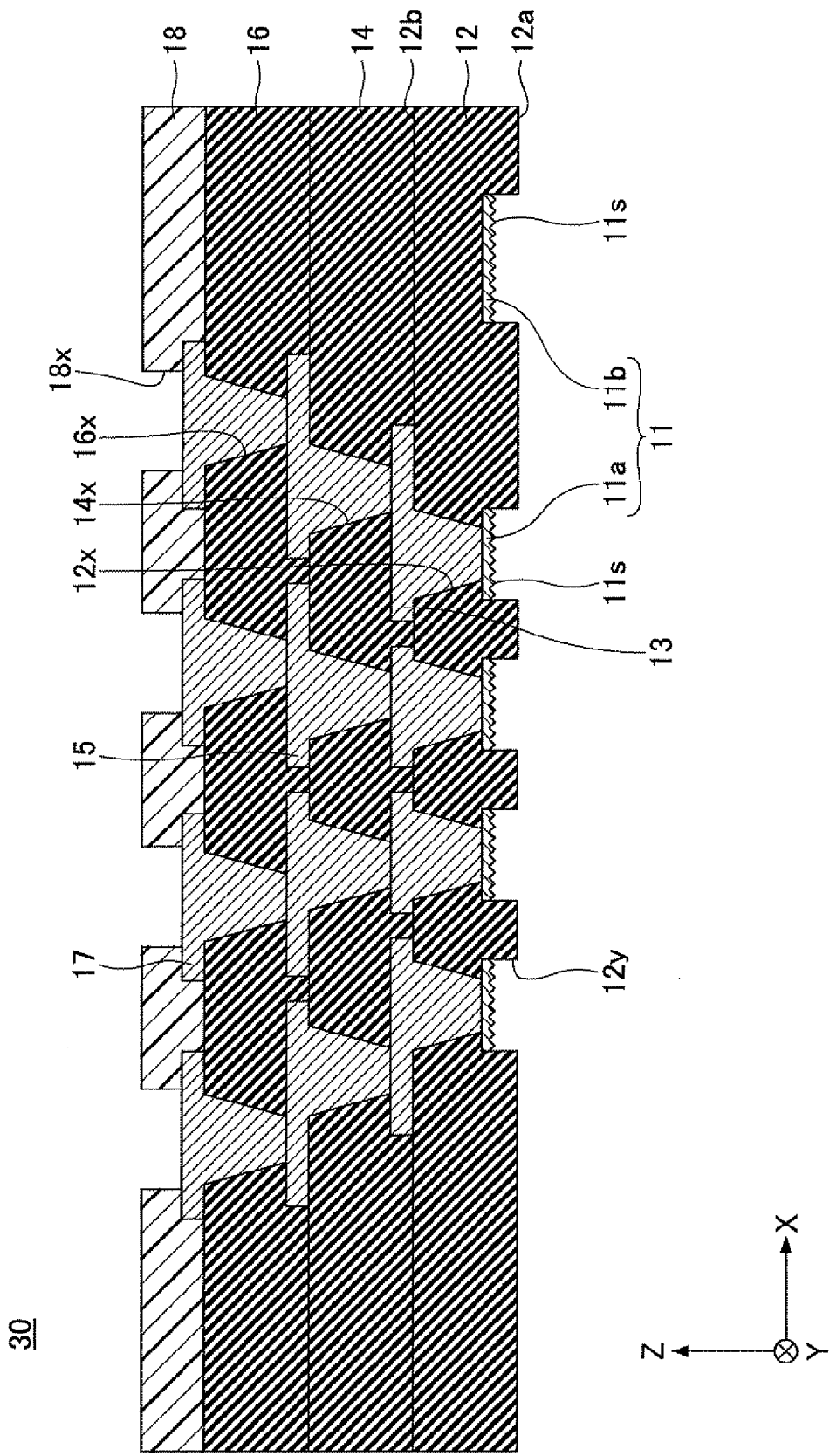
FIG. 27 is an example cross-sectional view of a wiring substrate of Embodiment 4.

FIG. 27 is an example cross-sectional view of a wiring substrate of Embodiment 4. Referring to FIG. 27, the same reference symbols are attached to the parts which are the same as those in FIG. 7, and descriptions of these parts are omitted. Referring to FIG. 27, the wiring substrate 30 is different from the wiring substrate 10 in that the recesses 12y are deepened. The depth or distance of the faces 11s from the surface 12a of the first insulating layer 12 may be about 15 to 30 μm. With the deepened recesses 12y, when solder balls are installed in the electrode pads 11a, it is possible to easily arrange the solder balls inside the recesses 12y.

FIG. 28 to FIG. 31 illustrate manufacturing steps using cross-sectional views of the wiring substrate of Embodiment 4. In FIG. 28 to FIG. 31, the same reference symbols are attached to the same parts as those in FIG. 7, and descriptions of these parts may be omitted.

Figure 28:
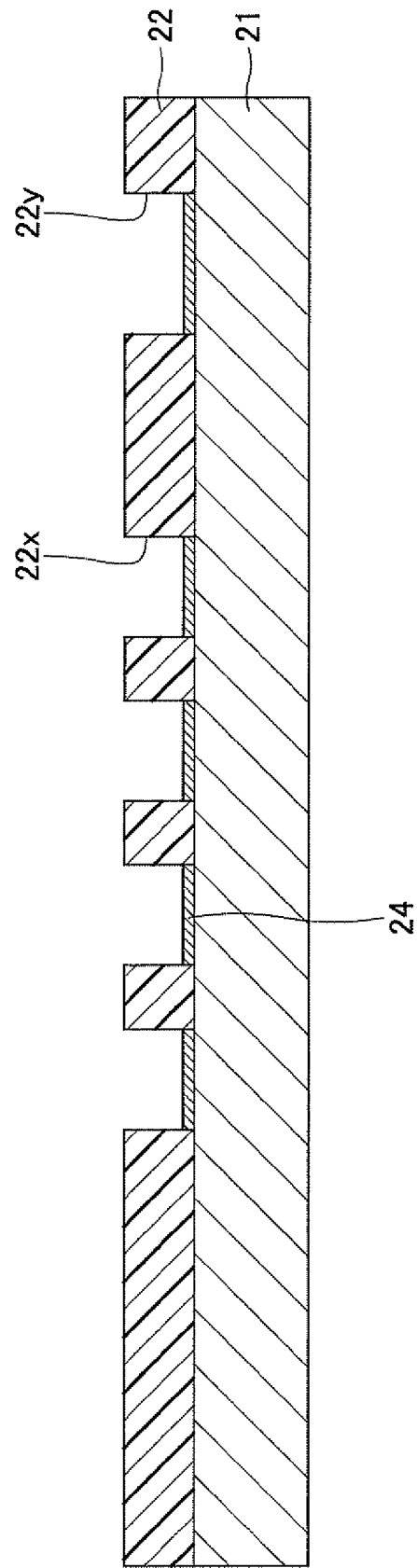
FIG. 28 illustrates a first manufacturing step using a cross-sectional view of a wiring substrate of Embodiment 4.

First, the same steps as those illustrated in FIG. 8 to FIG. 9 of Embodiment 1 are carried out. Referring to FIG. 28, a depth adjusting layer 24 is formed on the one surface of the supporting body 21 and inside the opening portions 22x and 22y by electrolytic plating in which the supporting body 21 is used as the power supplying layer. The material of the depth adjusting layer 24 is preferably removed by the same etching solution as that for the supporting body 21. With this, the supporting body 21 and the depth adjusting layer 24 are simultaneously removed by a wet etching using the same etching liquid in a step described with reference to FIG. 31. In Embodiment 4, since the material of the supporting body 21 is copper (Cu), the material of the depth adjusting layer 24 is also copper (Cu). The thickness of the depth adjusting layer 24 may be an arbitrary value to make the depths of the recesses 12y have an arbitrary value. For example, the thickness of the depth adjusting layer 24 is 10 to 15 μm.

Figure 29:
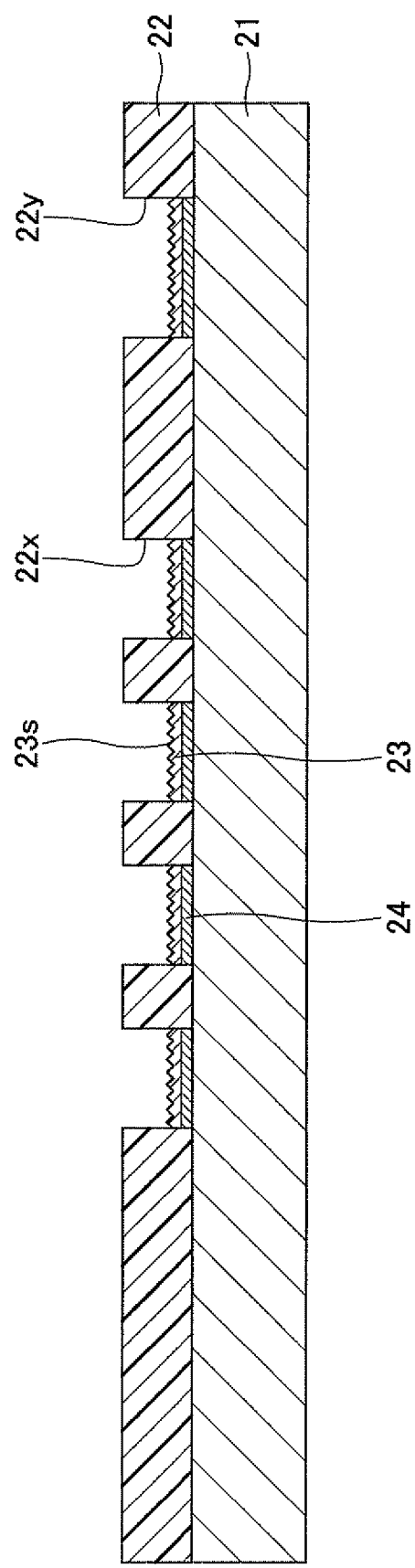
FIG. 29 illustrates a second manufacturing step using a cross-sectional view of the wiring substrate of Embodiment 4.

Referring to FIG. 29, the metallic layers 23 are formed on the one surface of the supporting body 21 and inside the opening portions 22x and 22y by electrolytic plating in which the supporting body 24 is used as the power supplying layer. By carrying out the same steps as those illustrated in FIG. 22 and FIG. 23, the faces 23s of the metallic layers 23 are roughened. Since details (material, thickness, and so on) of the metallic layers 23 are similar to Embodiment 1, description of these portions is omitted.

Figure 30:
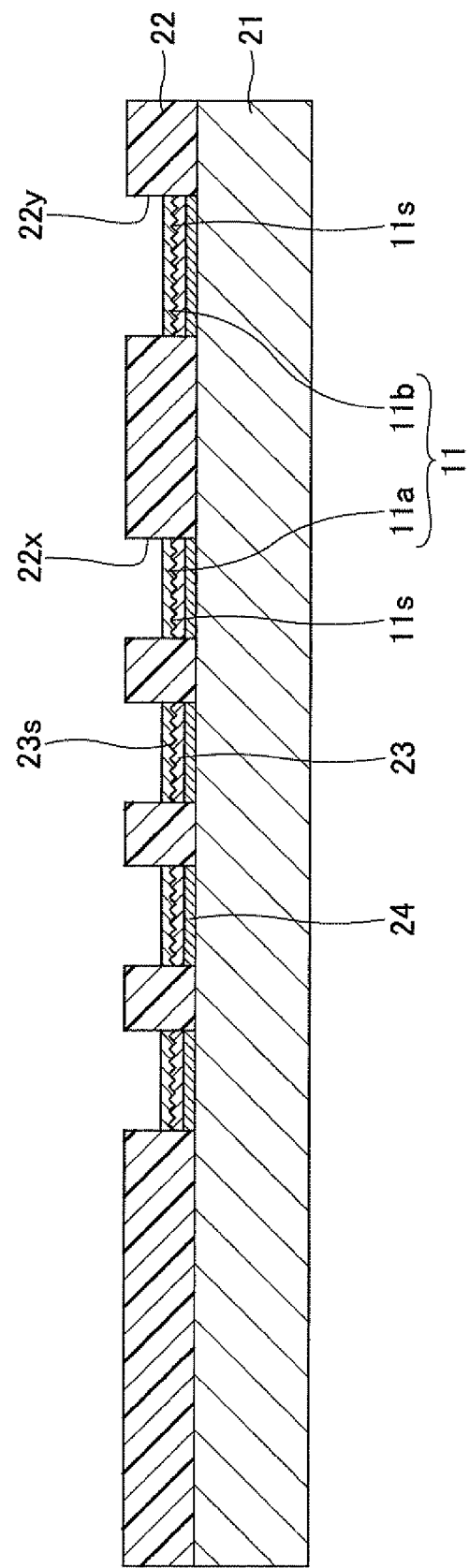
FIG. 30 illustrates a third manufacturing step using a cross-sectional view of the wiring substrate of Embodiment 4.
Figure 31:
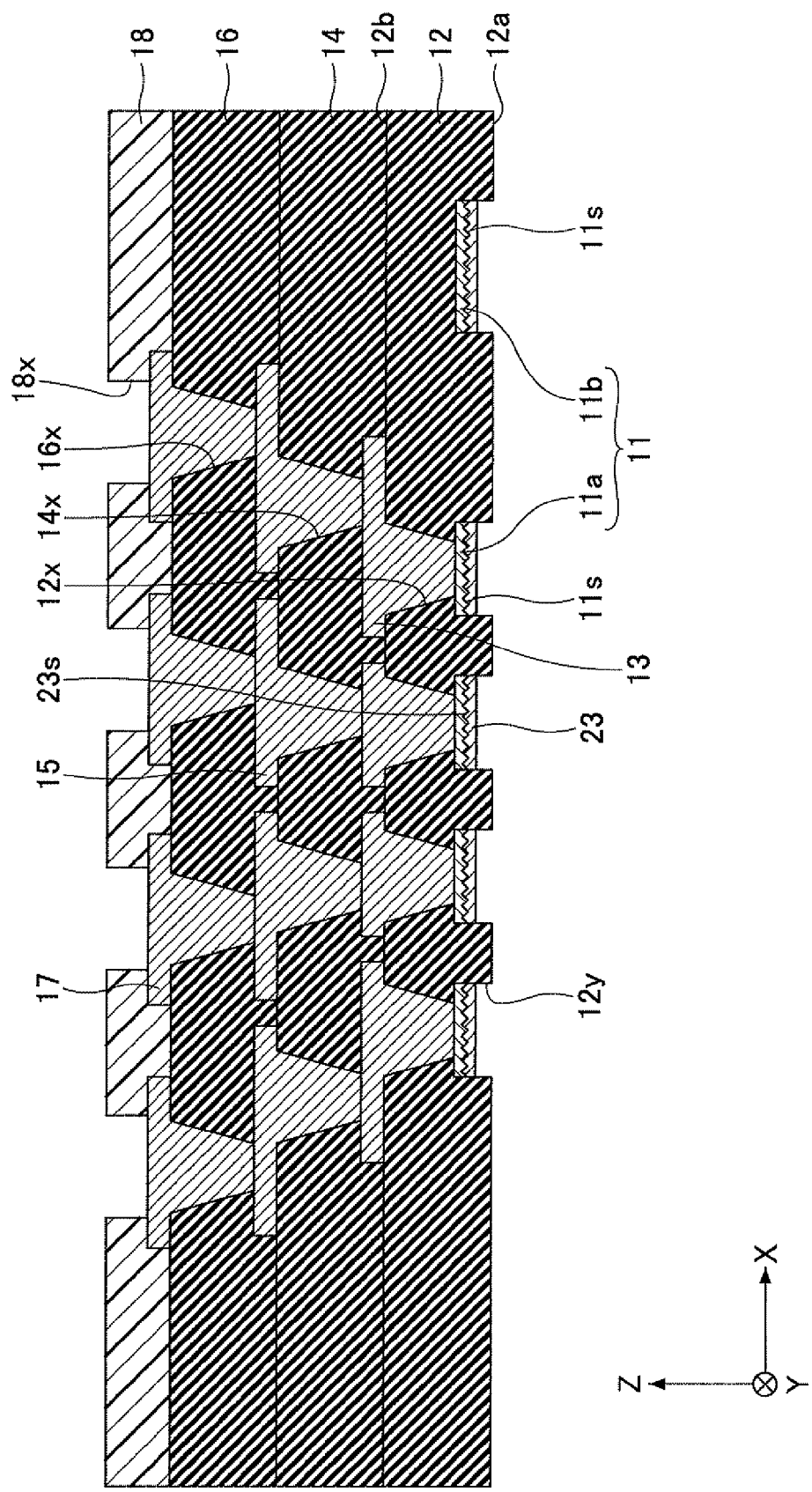
FIG. 31 illustrates a fourth manufacturing step using a cross-sectional view of the wiring substrate of Embodiment 4.

Referring to FIG. 30, the first wiring layers 11 are formed on the faces 23s of the metallic layers 23 inside the opening portions 22x and 22y by electrolytic plating in which the supporting body 21 is used as the power supplying layer in a similar manner to FIG. 24 and FIG. 25. The faces 23s of the metallic layers 23 are roughened in the step illustrated in FIG. 29. Therefore, the faces 11s of the first wiring layers 11 in contact with the faces 23s of the metallic layers 23 are also roughened. Since details (material, thickness, and so on) of the first wiring layers 11 are similar to Embodiment 1, description of these portions is omitted.

Thereafter, the same steps as those in Embodiment 1 illustrated in FIG. 12 to FIG. 16 are carried out, the supporting body 21 and the depth adjusting layer 24 illustrated in FIG. 30 are removed. The material of the supporting body 21 and the material of the depth adjusting layer 24 are copper (Cu) in Embodiment 4. With wet etching using aqueous ferric chloride, aqueous copper chloride, or aqueous ammonium persulfate, the supporting body 21 and the depth adjusting layer 24 are simultaneously removed. At this time, since the metallic layers 23 are made of nickel (Ni), the metallic layers 23 function as etching stop layers. Therefore, the supporting body 21 and the depth adjusting layer 24 are selectively etched so as to be removed. With this step, the other faces of the metallic layers 23 opposite to the faces 23s are exposed toward the inside of the recesses 12y. When the fourth wiring layer 17 is made of copper (Cu), the fourth wiring layers 17 are prevented from being etched together with the supporting body 21 and the depth adjusting layer 24 by masking the fourth wiring layers 17.

Next, the same steps as those illustrated in FIG. 18 of Embodiment 1 are carried out. By removing the metallic layers 23 illustrated in FIG. 31, the roughened faces 11s of the first wiring layers 11 having the predetermined surface roughness are recessed from the surface 12a of the first insulating layer 12. Thus, the wiring substrate 30 illustrated in FIG. 27 is completed. The depths of the recesses 12y are greater than those in the wiring substrate 10 illustrated in FIG. 7 by the thicknesses of the depth adjusting layers 24.

By increasing the thickness of the metallic layers 23 without providing the depth adjusting layers 24, the depths of the recesses 12y are increased. However, a time for removing nickel (Ni) by etching is longer than a time for removing copper (Cu) having the same thickness by etching. Therefore, from a point of view of reducing a time for manufacturing the wiring substrate, it is preferable to newly provide the depth adjusting layers 24 made of copper (Cu) rather than increasing the thickness of the metallic layers 23 made of nickel (Ni).

With this, similar effects to those in Embodiment 1 and Embodiment 2 are obtainable. Further, the following effects are obtainable. By providing the depth adjusting layer, the recesses in which the first wiring layers are formed may be adjusted to have an arbitrary depth. As a result, it is possible to easily arrange solder balls inside the recesses when the solder balls are installed on the electrode pads 11a.

The process of Embodiment 4 illustrated in FIG. 29 may be replaced by a step of Embodiment 3 illustrated in FIG. 26. Then, a similar effect to that in Embodiment 3 is obtainable.

Embodiment 5

With Embodiment 5, a semiconductor package formed by installing a semiconductor chip in the wiring substrate 10 is described.

[The Structure of the Semiconductor Package of Embodiment 5]

Figure 32:
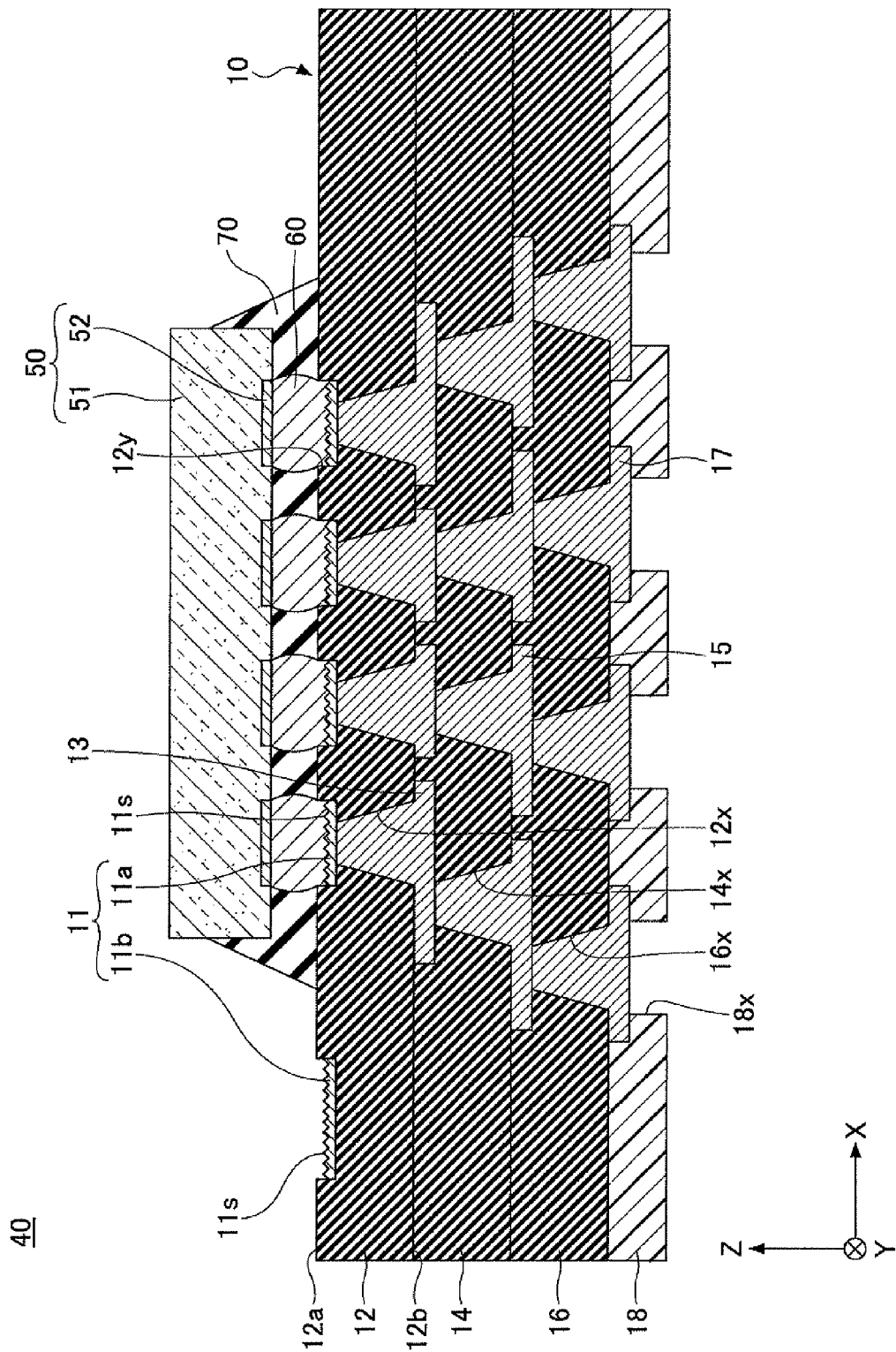
FIG. 32 is a cross-sectional view of a semiconductor package of Embodiment 5.

First, the structure of the semiconductor package of Embodiment 5 is described. FIG. 32 is a cross-sectional view of the semiconductor package of Embodiment 5. Referring to FIG. 32, the same reference symbols are attached to the parts which are the same as those in FIG. 7, and descriptions of these parts are omitted.

Referring to FIG. 32, the semiconductor package 40 includes the wiring substrate 10 illustrated in FIG. 7, a semiconductor chip 50, solder bumps 60, and underfill resin 70. In the semiconductor package 40, the semiconductor chip 50 is mounted on a substantially central portion of the wiring substrate 10 via the solder bumps 60. The semiconductor chip 50, the solder bumps 60, and the wiring substrate 10 are sealed by the underfill resin 70. FIG. 32 illustrates a cross-sectional view of the wiring substrate 10 viewed from the opposite side of the wiring substrate 10 illustrated in FIG. 7.

The semiconductor chip 50 includes a semiconductor substrate 51 and electrode pads 52. The semiconductor substrate 51 is made of silicon (Si) and has an integrated circuit (not illustrated) formed on the substrate. The electrode pads 52 are formed on one side of the semiconductor substrate 51 and electrically connected to the integrated circuit (not illustrated). The material of the electrode pads 52 may be Al.

The solder bumps 60 electrically connect the electrode pads 11a of the wiring substrate 10 to the electrode pads 52 of the semiconductor chip 50. The material of the solder bumps 60 may be an alloy containing Pb, an alloy containing Sn and Cu, an alloy containing Sn and Ag, an alloy containing Sn, Ag, and Cu, or the like.

The underfill resin 70 is supplied between the wiring substrate 10 and the semiconductor chip 50. The underfill resin 70 has a function of relaxing a thermal stress generated between the wiring substrate 10 including the solder bumps 60 and the semiconductor chip 50 by a difference of coefficients of thermal expansion of the wiring substrate 10 and the semiconductor chip 50. The underfill resin may be a thermosetting liquid-like insulating resin having a relatively low viscosity.

It is possible to mount various electronic components such as a chip capacitor and a chip resistor other than the semiconductor chip 50.

[The Manufacturing Method of the Semiconductor Package of Embodiment 5]

Figure 33:
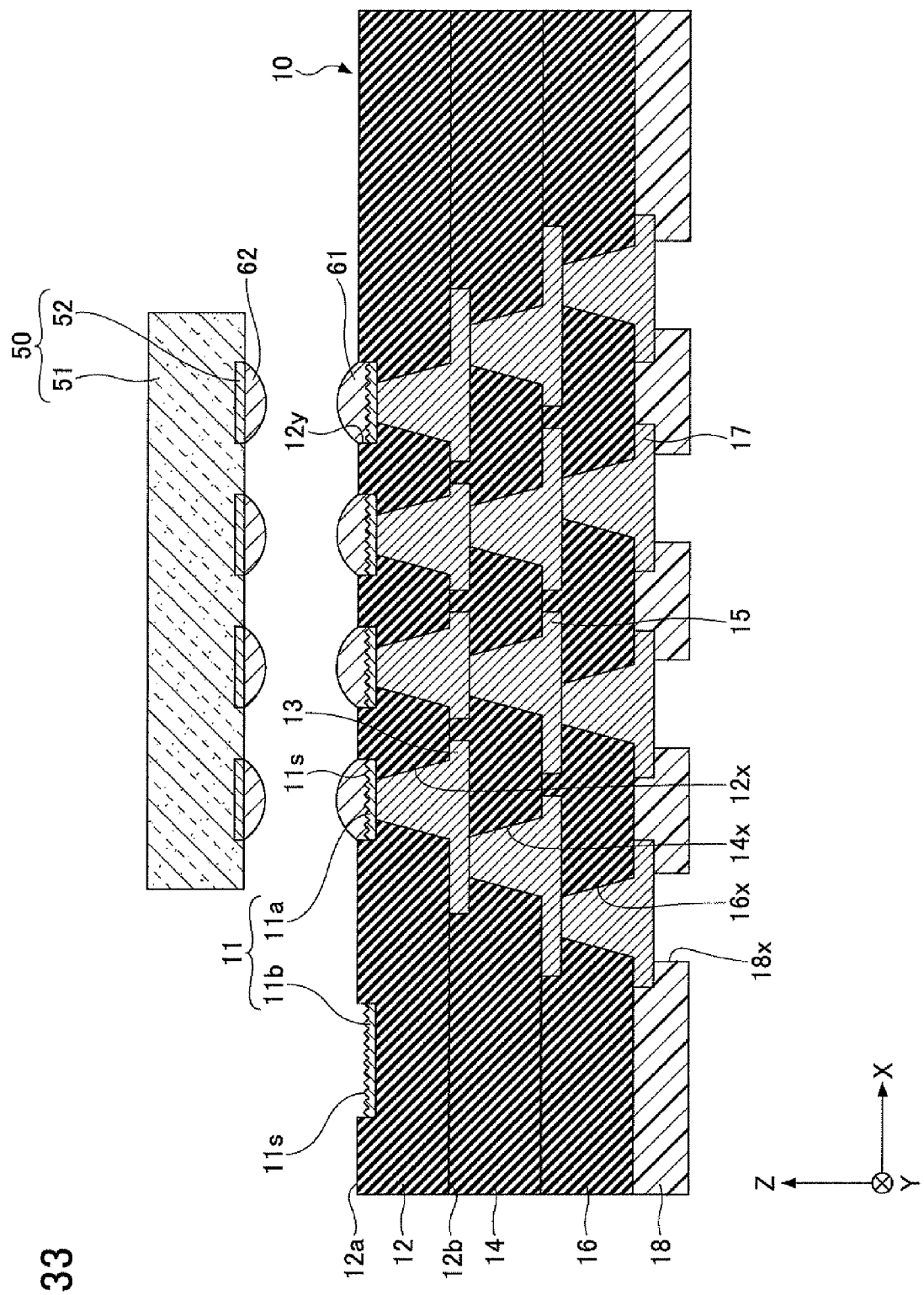
FIG. 33 illustrates a first manufacturing step using a cross-sectional view of the semiconductor package of Embodiment 5.
Figure 34:
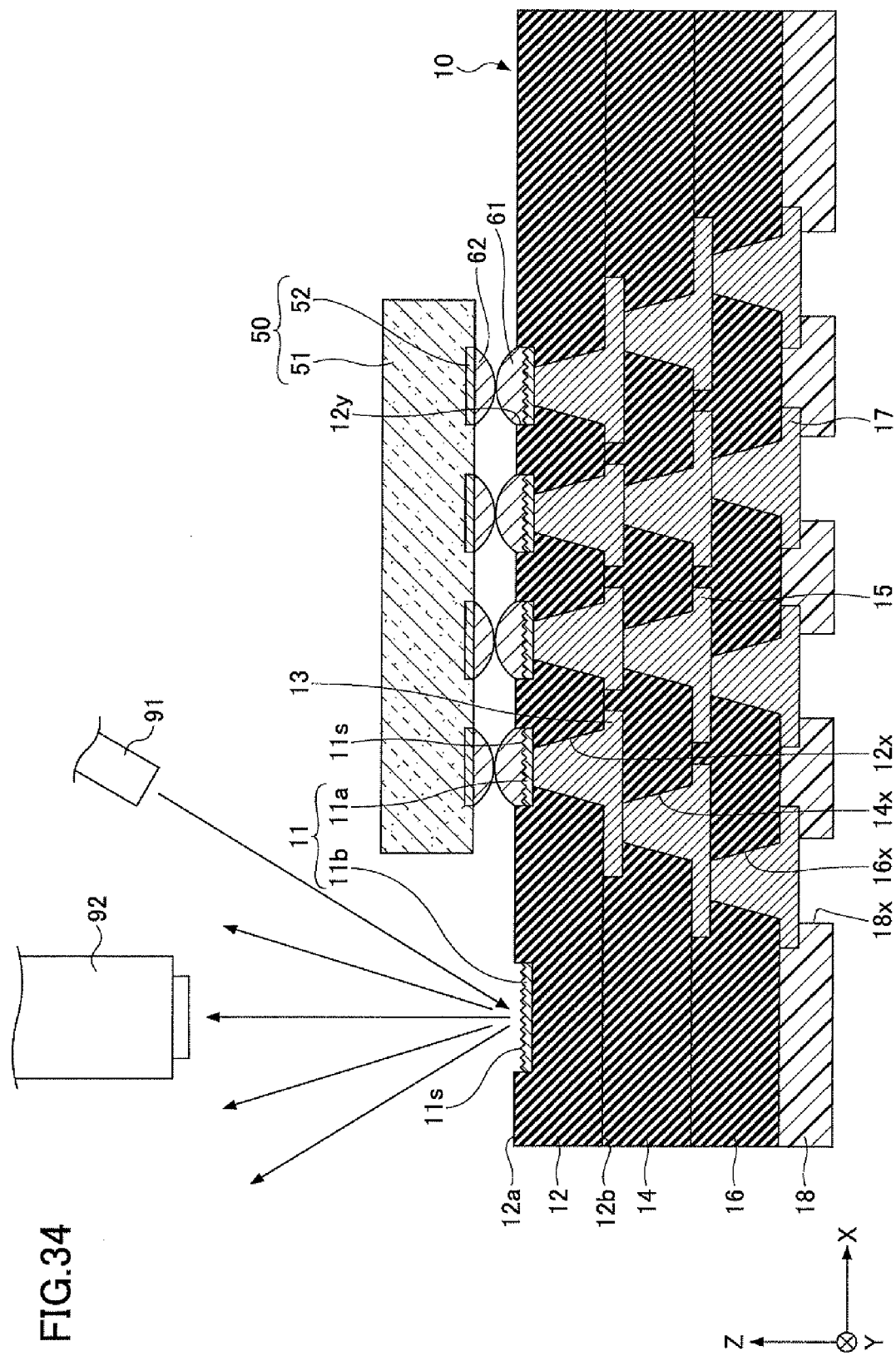
FIG. 34 illustrates a second manufacturing step using a cross-sectional view of the semiconductor package of Embodiment 5.

Next, the manufacturing method of the semiconductor package of Embodiment 5 is described. FIG. 33 and FIG. 34 illustrate manufacturing processes of the semiconductor package of Embodiment 5. In FIG. 33 to FIG. 34, the same reference symbols are attached to the same parts as those in FIG. 21 or FIG. 32, and descriptions of these parts are omitted.

Referring to FIG. 33, the wiring substrate 10 illustrated in FIG. 7 and the semiconductor chip 50 manufactured by a known method are prepared. Presolders 61 are provided on the electrode pads 11a of the wiring substrate 10, and presolders 62 are provided on the electrode pads 52 of the semiconductor chip 50. The materials of the presolders 61 and 62 may be an alloy containing Pb, an alloy containing Sn and Cu, an alloy containing Sn and Ag, an alloy containing Sn, Ag, and Cu, or the like. The presolders 61 and 62 are formed on the electrode pads 11a of the wiring substrate 10 and the electrode pads 52 of the semiconductor chip 50, respectively, after coating a solder paste and reflowing the electrode pads 11a and 52 with the solder paste at a predetermined temperature.

Subsequently, in the step of FIG. 34, the electrode pads 11a of the wiring substrate 10 are arranged to face the electrode pads 52 of the semiconductor chip 50 so that the presolders 61 faces the presolders 62. The wiring substrate 10 is aligned with the semiconductor chip 50 using an alignment device (not illustrated) having a light source 91 and a light receiving unit 92 of a CCD camera or the like.

Specifically, the light source 91 irradiates the face 11s of the alignment mark 11b with visible light, and light reflected on the face 11s is received by the light receiving unit 92 of the CCD camera or the like to thereby recognize the alignment mark 11b. Based on the recognized alignment mark 11b, the semiconductor chip 50 is aligned with the wiring substrate 10.

As described, since the face 11s of the alignment mark 11b is roughened to have a predetermined surface roughness Ra in a range of 50 nm<Ra<200 nm, the irradiating light from the light source 91 is reflected diffusely. Therefore, most of the irradiating light is transmitted in a direction of the light receiving unit 92 and impinges upon the light receiving unit 92. Therefore, the alignment mark 11b can be easily recognized. When the alignment mark 11b is recognized, the semiconductor chip 50 can be properly mounted on the wiring substrate 10.

When various electronic components such as a chip capacitor and a chip resistor are mounted other than the semiconductor chip 50, by recognizing the alignment mark 11b in a similar manner to the above, the various electronic components such as the chip capacitor and the chip resistor are properly installed at correct positions.

By heating the presolders 61 and 62 at 230° C. to melt these presolders 61 and 62, the solder bumps 60 are formed. Further, by supplying the underfill resin 70 made of a thermosetting liquid-like insulating resin having a relatively low viscosity between the wiring substrate 10 and the semiconductor chip 50, the semiconductor package 40 illustrated in FIG. 32 is completed.

With Embodiment 5, since the alignment mark is easily recognized by mounting the semiconductor chip on the wiring substrate having the alignment mark of which surface roughness Ra of the roughened face is 50 nm<Ra<200 nm, it is possible to manufacture the semiconductor package in which the semiconductor chip is mounted on a correct position on the wiring substrate.

When the manufactured semiconductor package is mounted on an implementation board such as a mother board, the alignment mark can be easily recognized. Therefore, the semiconductor package can be installed at a correct position on the implementation board.

Modified Example of Embodiment 5

The electrode pads 11a are used for installing the semiconductor chip and the alignment mark 11b is used to align the semiconductor chip in Embodiment 5. In the modified example of Embodiment 5, the electrode pads 11a may be used for mounting various electronic components such as a chip capacitor and electrode pads (e.g. ball grid array (BGA) pads or pin grid array (PGA) pads) to form external connection terminals for connecting to a mounting board such as a motherboard. The electrode pads 11a may be used as standards for aligning various electronic components such as a chip capacitor and solder balls to be external connection terminals. In the modified example of Embodiment 5, descriptions the same as those of Embodiment 5 are omitted, and portions different from Embodiment 5 are mainly described.

Figure 35:
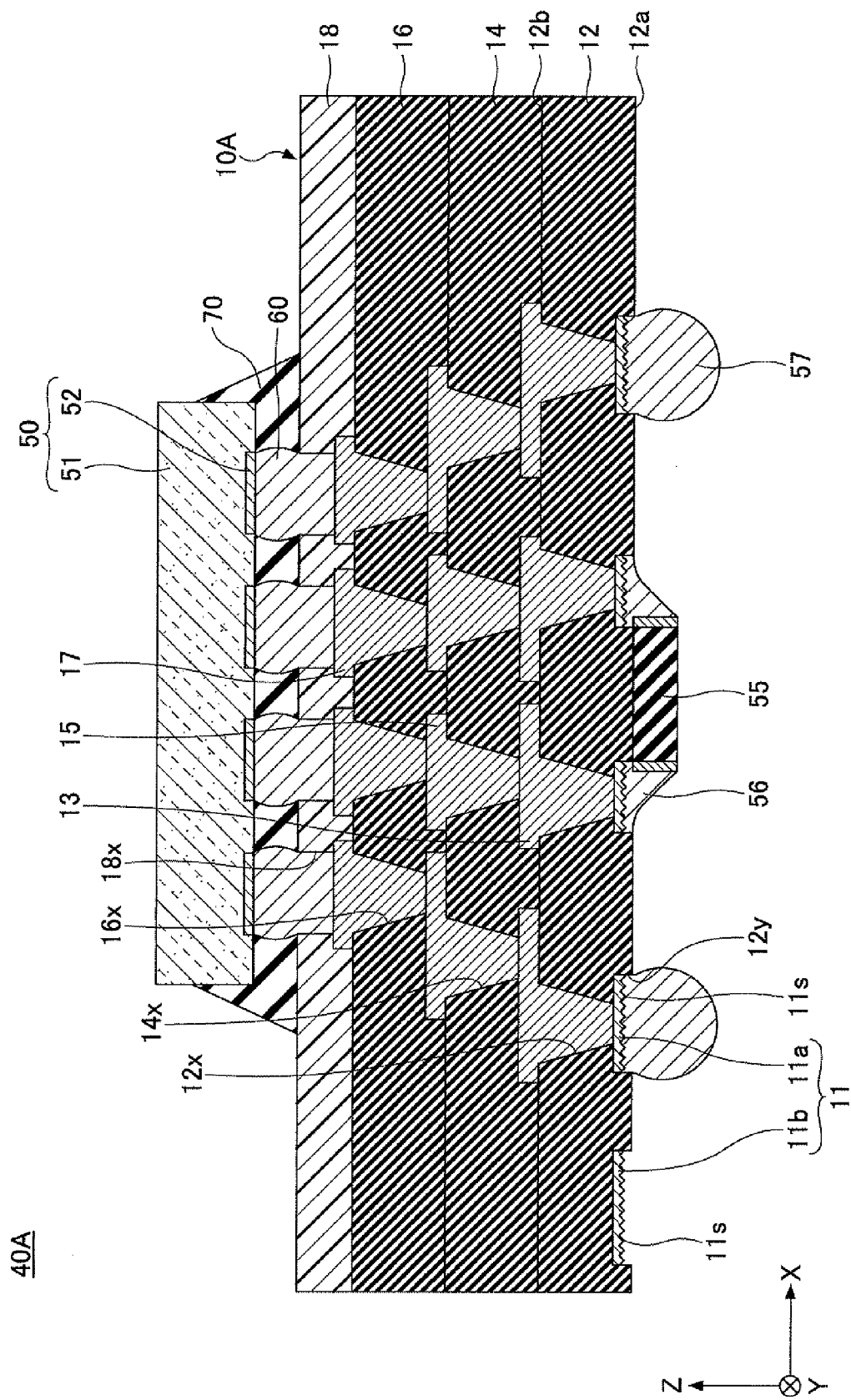
FIG. 35 is a cross-sectional view of a semiconductor package of a modified example of Embodiment 5.

FIG. 35 is a cross-sectional view of a semiconductor device of a modified example of Embodiment 5. Referring to FIG. 35, the same reference symbols are attached to the parts same as those in FIG. 32, and descriptions of these parts are omitted. Referring to FIG. 35, in a semiconductor package 40A, the semiconductor chip 50 is mounted on one face of a wiring substrate 10A, and a chip capacitor 55 and external connection terminals 57 are mounted on the other face of the wiring substrate 10a.

The wiring substrate 10A is formed by a similar manufacturing method to that of the wiring substrate 10. In the wiring substrate 10, the pitch of the electrode pads 11a of the first wiring layers 11 is less than a pitch of the fourth wiring layers 17 exposed inside the opening portions 18x of the solder resist layer 18 so that the semiconductor chip is installed on a side of the first wiring layers 11. Meanwhile, in the wiring substrate 10A, the pitch of the fourth wiring layers 17 exposed inside the opening portions 18x of the solder resist layer 18 is less than the pitch of the electrode pads 11a of the first wiring layers 11.

In the wiring substrate 10A, the fourth wiring layers 17 exposed inside the opening portions 18x of the solder resist layer 18 function as electrode pads connected to the semiconductor chip. The electrode pads 11a (e.g. BGA pad or PGA pad) included in the first wiring layers 11 function as the external connection terminals 57 for connecting to the mounting board or an electrode pad for mounting various electronic components such as the chip capacitor 55.

The chip capacitor 55 is electrically connected to the electrode pads 11a by solders 56. The material of the solders 56 may be an alloy containing Pb, an alloy containing Sn and Cu, an alloy containing Sn and Ag, an alloy containing Sn, Ag, and Cu, or the like.

The external connection terminals 57 are formed on the electrode pads 11a. The external connection terminals 57 may be formed by arranging solder balls on the electrode pads 11a inside the recesses 12y and melting the solder balls. The material of the solder balls 57 may be an alloy containing Pb, an alloy containing Sn and Cu, an alloy containing Sn and Ag, an alloy containing Sn, Ag, and Cu, or the like. However, a lead pin or the like may be used as the external connection terminals 57.

With the modified example of Embodiment 5, the external connection terminals 57 are formed. However, the external connection terminals 57 may not be formed. When necessary, parts of the first wiring layers 11 may be exposed from the first insulating layer 12 so as to be used as pads on which external connection terminals 57 are formed.

The alignment mark 11b may be used as a standard for aligning various electronic components such as the chip capacitor 55 and the solder balls to be the external connection terminals 57 on the wiring substrate 10A. Various electronic components such as a chip resistor and a chip inductor may be mounted other than the chip capacitor 55.

As described, with the modified example of Embodiment 5, the various electronic components such as the chip capacitor and the solder balls to be the external connection terminals are installed in the semiconductor package having the wiring substrate which has the alignment mark of which surface roughness Ra of the roughened face is in the predetermined range of 50 nm<Ra<200 nm. In this case, since the roughened face having the surface roughness Ra of 50 nm<Ra<200 nm can be easily recognized, it becomes possible to manufacture the semiconductor package which is formed by arranging the various electronic components or the solder balls to be the external connection terminals at correct positions on the wiring substrate.

As described in Embodiment 5 and the modified example of Embodiment 5, the alignment mark 11b can be used as the standard for aligning the various electronic components such as a semiconductor chip, a chip capacitor, a chip resistor, and a chip inductor, and the standard for aligning the wiring substrate 10 or the wiring substrate 10A to the other wiring substrate. The alignment mark 11b may be used as a standard for aligning a component such as the solder balls to be the external connection terminals 57 other than the electronic components.

Embodiment 1 to Embodiment 5 illustrate the case where the roughened face of the electrode pads exposed from the insulating layer and the other roughened face of the alignment mark have the surface roughness Ra in a range of 50 nm<Ra<200 nm. However, it is sufficient when the roughened face of the alignment mark exposed from the insulating layer has the surface roughness in a range of 50 nm<Ra<200 nm.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:
a plurality of wiring layers;
a plurality of insulating layers;
an alignment mark embedded in an outermost insulating layer of the plurality of insulating layers, the outermost insulating layer being a surface of the wiring substrate;
a pad embedded in the outermost insulating layer of the plurality of insulating layers; and
a via forming a part of the wiring layers, the via being provided in the outermost insulating layer, the via being connected to a back surface of the pad,
wherein a front face of the alignment mark is exposed on a surface of the outermost insulating layer,
side and back faces of the alignment mark are coated by the outermost insulating layer,
a front face of the pad is exposed on the surface of the outermost insulating layer,
side and back faces of the pad are coated by the outermost insulating layer, and
the front face of the alignment mark and the front face of the pad are roughened.

2. The wiring substrate according to claim 1,
wherein a surface roughness of the front face of the alignment mark and a surface roughness of the front face of the pad are in a range greater than 50 nm and smaller than 200 nm.

3. The wiring substrate according to claim 1,
wherein the surface roughness of the front face of the alignment mark differs from the surface roughness of the surface of the outermost insulating layer.

4. The wiring substrate according to claim 1,
wherein a planar shape of the alignment mark is circular, rectangular or cross-shaped.

5. A wiring substrate comprising:
a plurality of wiring layers;
a plurality of insulating layers;
an alignment mark embedded in an outermost insulating layer of the plurality of insulating layers, the outermost insulating layer being a surface of the wiring substrate;
a pad embedded in the outermost insulating layer of the plurality of insulating layers; and
a via forming a part of the wiring layers, the via being provided in the outermost insulating layer, the via being connected to a back surface of the pad,
wherein a front face of the alignment mark is exposed on a surface of the outermost insulating layer,
side and back faces of the alignment mark are coated by the outermost insulating layer,
a front face of the pad is exposed on the surface of the outermost insulating layer,
side and back faces of the pad are coated by the outermost insulating layer, and
the front face of the alignment mark and the front face of the pad are roughened to have a surface roughness in a range greater than 50 nm and smaller than 200 nm.

6. The semiconductor package according to claim 5,
wherein the surface roughness of the front face of the alignment mark differs from the surface roughness of the surface of the outermost insulating layer.

7. The semiconductor package according to claim 5,
wherein a planar shape of the alignment mark is, circular, rectangular or cross-shaped.

8. A semiconductor package comprising:
a semiconductor chip; and
a wiring substrate, on which the semiconductor chip is mounted, the wiring substrate including
a plurality of wiring layers,
a plurality of insulating layers,
an alignment mark embedded in an outermost insulating layer of the plurality of insulating layers, the outermost insulating layer being a surface of the wiring substrate,
a pad embedded in the outermost insulating layer of the plurality of insulating layers, and
a via forming a part of the wiring layers, the via being provided in the outermost insulating layer, the via being connected to a back surface of the pad,
wherein a front face of the alignment mark is exposed on a surface of the outermost insulating layer,
side and back faces of the alignment mark are coated by the outermost insulating layer,
a front face of the pad is exposed on the surface of the outermost insulating layer,
side and back faces of the pad are coated by the outermost insulating layer, and
the front face of the alignment mark and the front face of the pad are roughened.

9. The semiconductor package according to claim 8, wherein a surface roughness of the front face of the alignment mark and a surface roughness of the front face of the pad are in a range greater than 50 nm and smaller than 200 nm.

10. The semiconductor package according to claim 8, wherein the surface roughness of the front face of the alignment mark differs from the surface roughness of the surface of the outermost insulating layer.

11. The semiconductor package according to claim 8, wherein a planar shape of the alignment mark is circular, rectangular or cross-shaped.

* * * * *